United States Patent
Maruyama et al.

(10) Patent No.: US 11,532,415 B2
(45) Date of Patent: Dec. 20, 2022

(54) ELECTRONIC COMPONENT AND ELECTRONIC APPARATUS

(71) Applicant: TAIYO YUDEN CO., LTD., Tokyo (JP)

(72) Inventors: Yoshikazu Maruyama, Takasaki (JP); Noriyuki Mabuchi, Takasaki (JP); Ichiro Yokoyama, Takasaki (JP); Masataka Kohara, Wakayama (JP); Keiichi Nozawa, Wakayama (JP); Masakazu Okazaki, Wakayama (JP); Chikako Yoshida, Wakayama (JP); Tomoyuki Oyoshi, Wakayama (JP); Ikuo Kakiuchi, Wakayama (JP); Masami Seto, Wakayama (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 15 days.

(21) Appl. No.: 17/364,631

(22) Filed: Jun. 30, 2021

(65) Prior Publication Data

US 2021/0327623 A1 Oct. 21, 2021

Related U.S. Application Data

(63) Continuation of application No. 16/002,973, filed on Jun. 7, 2018, now Pat. No. 11,087,909.

(30) Foreign Application Priority Data

Jun. 16, 2017 (JP) .............................. JP2017-118913

(51) Int. Cl.
*H01F 27/29* (2006.01)
*H01F 5/06* (2006.01)
(Continued)

(52) U.S. Cl.
CPC .............. *H01F 5/06* (2013.01); *H01F 27/022* (2013.01); *H01F 27/292* (2013.01);
(Continued)

(58) Field of Classification Search
CPC ........ H01F 5/06; H01F 27/022; H01F 27/292; H01F 27/327; H01G 4/008; H01G 4/012;
(Continued)

(56) References Cited

U.S. PATENT DOCUMENTS 6,232,867 B1 * 5/2001 Yoshida ................. H01C 7/102
338/21
2008/0242532 A1 10/2008 Nishikawa
2009/0108984 A1 4/2009 Choi et al.

FOREIGN PATENT DOCUMENTS

JP H08162357 A 6/1996
JP H11162772 A 6/1999
(Continued)

OTHER PUBLICATIONS

A Notice of Reasons for Refusal issued by the Japanese Patent Office, dated Apr. 6, 2021, for Japanese counterpart application No. 2017-118913. (5 pages).
(Continued)

*Primary Examiner* — Tuyen T Nguyen
(74) *Attorney, Agent, or Firm* — Law Office of Katsuhiro Arai

(57) ABSTRACT

An electronic component includes: an insulator part (10) of rectangular solid shape; a coil element (32) provided inside the insulator part (10); bottom electrodes (40) provided on a bottom face (14) of the insulator part (10) and electrically connected to the coil element (32); a plating layer (62) provided in a manner overlapping each bottom electrode (40) so that its end (64) on the bottom face (14) is away from the end (42) of the bottom electrode (40); a plating layer (60)
(Continued)

which is arranged between the bottom electrode (40) and the plating layer (62) and overlaps the bottom electrode (40), and which is constituted by a metal having lower solder wettability and higher melting point than those of the plating layer (62); and an insulation layer (70) provided on the bottom face (14) in a manner covering the end (42) of the bottom electrode (40).

9 Claims, 19 Drawing Sheets

(51) Int. Cl.
| | | |
|---|---|---|
| *H01G 4/008* | (2006.01) | |
| *H05K 1/18* | (2006.01) | |
| *H01L 49/02* | (2006.01) | |
| *H05K 1/02* | (2006.01) | |
| *H05K 3/34* | (2006.01) | |
| *H01F 27/32* | (2006.01) | |
| *H01F 27/02* | (2006.01) | |
| *H01G 4/232* | (2006.01) | |
| *H01G 4/30* | (2006.01) | |
| *H01G 4/12* | (2006.01) | |
| *H01G 4/012* | (2006.01) | |

(52) U.S. Cl.
CPC ............ *H01F 27/327* (2013.01); *H01G 4/008* (2013.01); *H01G 4/012* (2013.01); *H01G 4/12* (2013.01); *H01G 4/232* (2013.01); *H01G 4/30* (2013.01); *H01L 28/60* (2013.01); *H05K 1/0271* (2013.01); *H05K 1/181* (2013.01); *H05K 3/3442* (2013.01); *H05K 2201/10015* (2013.01); *H05K 2201/10265* (2013.01); *H05K 2201/10636* (2013.01)

(58) Field of Classification Search
CPC . H01G 4/12; H01G 4/232; H01G 4/30; H01L 28/60; H05K 1/0271; H05K 1/181; H05K 3/3442; H05K 2201/10015; H05K 2201/10265; H05K 2201/10636; Y02P 70/50
See application file for complete search history.

(56) References Cited

FOREIGN PATENT DOCUMENTS

| | | | |
|---|---|---|---|
| JP | 2002280254 A | | 9/2002 |
| JP | 2004288956 A | * | 10/2004 |
| JP | 4637440 B2 | * | 2/2011 |
| JP | 2011204778 A | | 10/2011 |
| JP | 2012104745 A | | 5/2012 |
| JP | 2012156171 A | | 8/2012 |
| JP | 2014068000 A | | 4/2014 |
| JP | 2015029009 A | | 2/2015 |
| JP | 2018078189 A | | 5/2018 |

OTHER PUBLICATIONS

Non-Final Office Action issued by U.S. Patent and Trademark Office, dated Dec. 10, 2020, for related U.S. Appl. No. 16/002,973 (13 pages).
Notice of Allowance issued by U.S. Patent and Trademark Office, dated Mar. 31, 2021, for related U.S. Appl. No. 16/002,973 (7 pages).

* cited by examiner

ELECTRONIC COMPONENT AND ELECTRONIC APPARATUS

CROSS-REFERENCE TO RELATED APPLICATIONS

This application is a continuation of U.S. patent application Ser. No. 16/002,293, filed Jun. 7, 2018, which claims priority to Japanese Patent Application No. 2017-118913, filed Jun. 16, 2017, each disclosure of which is herein incorporated by reference in its entirety. The applicant herein explicitly rescinds and retracts any prior disclaimers or disavowals made in any parent, child or related prosecution history with regard to any subject matter supported by the present application.

BACKGROUND

Field of the Invention

The present invention relates to an electronic component, electronic apparatus, and method for manufacturing electronic component.

Description of the Related Art

Electronic components, each comprising an electronic element housed inside an insulator part of rectangular solid shape, where electrodes electrically connected to the electronic element are provided on the surface of the insulator part, are known (refer to Patent Literature 1, for example). In addition, electronic components constituted so that a plating layer is provided in a manner covering the electrodes, are also known (refer to Patent Literatures 2 and 3, for example). It should be noted that, in Patent Literature 3, the plating layer covers the entire surface of the bottom electrode; as is evident from the reference, the greater the area of the bottom electrode, the higher the mounting strength becomes.

BACKGROUND ART LITERATURES

| | |
|---|---|
| [Patent Literature 1] | Japanese Patent Laid-open No. 2011-204778 |
| [Patent Literature 2] | Japanese Patent Laid-open No. 2012-156171 |
| [Patent Literature 3] | Japanese Patent Laid-open No. 2012-104745 |

SUMMARY

An electronic component comprising an electronic element provided inside an insulator part, where a metal layer electrically connected to the electronic element is provided on the surface of the insulator part, may generate cracking in the insulator part when the metal layer is joined to a circuit board.

The present invention was developed in light of the aforementioned problem, and its object is to prevent cracking from generating in the insulator part.

Any discussion of problems and solutions involved in the related art has been included in this disclosure solely for the purposes of providing a context for the present invention, and should not be taken as an admission that any or all of the discussion were known at the time the invention was made.

The present invention represents an electronic component comprising: an insulator part of rectangular solid shape; an electronic element provided inside the insulator part; a first metal layer provided on the first face of the insulator part and electrically connected to the electronic element; a second metal layer provided in a manner covering the first metal layer in such a way that it overlaps with the first metal layer so that its end on the first face of the insulator part is away from the end of the first metal layer; and a third metal layer which is arranged between the first metal layer and the second metal layer and covers the first metal layer, and which is constituted by a metal having lower solder wettability and whose melting point is higher, than the second metal layer.

In the aforementioned constitution, the third metal layer may cover the entire first metal layer.

The present invention represents an electronic component comprising: an insulator part of rectangular solid shape; an electronic element provided inside the insulator part; a first metal layer provided on the first face of the insulator part and electrically connected to the electronic element; and a second metal layer which is provided in a manner covering the first metal layer in such a way that it overlaps with the first metal layer so that its end on the first face of the insulator part is away from the end of the first metal layer, and which is constituted by a metal having higher solder wettability and whose melting point is lower, than the first metal layer.

In the aforementioned constitution, the end of the second metal layer may be provided away from the end of the first metal layer by approximately 3 μm or more.

In the aforementioned constitution, an insulation layer whose solder wettability is lower than that of the second metal layer may be provided on the first face of the insulator part in a manner covering the end of the first metal layer, and the end of the second metal layer may overlap the first metal layer via the insulation layer.

In the aforementioned constitution, a pair of the first metal layers may be provided away from one another on the first face of the insulator part, and the insulation layer may extend from one to the other of the pair of the first metal layers.

In the aforementioned constitution, the end of the first metal layer may have a curved shape on a plan view of the first face of the insulator part (i.e., as viewed from a direction toward the first face).

In the aforementioned constitution, a fourth metal layer may be provided on the second face of the insulator part in a manner electrically connected to the electronic element, the second metal layer may be provided in a manner covering the first metal layer and the fourth metal layer, and the end of the second metal layer on the second face of the insulator part is away from the end of the fourth metal layer but overlaps the fourth metal layer.

In the aforementioned constitution, the second metal layer may be a tin plating layer.

In the aforementioned constitution, the electronic element may be a coil element or capacitor element.

The present invention represents an electronic apparatus comprising an electronic component according to the above, and a circuit board to which the second metal layer of the electronic component has been joined via solder.

The present invention represents a method for manufacturing an electronic component comprising: a step to form an electronic element inside an insulator part of rectangular solid shape; a step to form, on a face of the insulator part, a first metal layer electrically connected to the electronic element; a step to form, on the face of the insulator part, an insulation layer covering the end of the first metal layer; and a step to form, by using the insulation layer as a mask, a second metal layer which covers the first metal layer, and which is constituted by a metal having higher solder wettability and whose melting point is lower, than the first metal layer.

The present invention represents a method for manufacturing electronic component comprising: a step to form an electronic element inside an insulator part of rectangular solid shape; a step to form, on a face of the insulator part, a first metal layer electrically connected to the electronic element; a step to form, on the face of the insulator part, an insulation layer covering the end of the first metal layer; a step to form a third metal layer covering the first metal layer; and a step to form, by using the insulation layer as a mask, a second metal layer which covers the third metal layer, and which is constituted by a metal having higher solder wettability and whose melting point is lower, than the third metal layer.

In the aforementioned constitution, the step to form an insulation layer may be such that the insulation layer is formed in a manner covering the end of the first metal layer so that, when the second metal layer is formed, the formed end of the second metal layer will be away from the end of the first metal layer by approximately 3 µm or more.

According to the present invention, generation of cracking in the insulator part can be prevented.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DESCRIPTION OF THE SYMBOLS

Figure 1A:
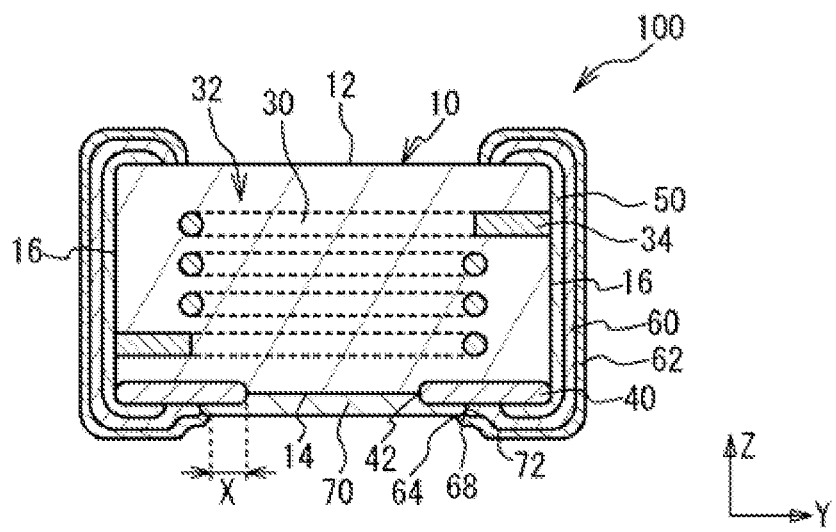
FIG. 1A is a cross-sectional view of the coil component pertaining to Example 1.

10 Insulator part
12 Top face
14 Bottom face
16 End face
18 Side face
30 Conductor
32 Coil element
34 Lead-out conductor
36 Via hole conductor
38 Capacitor element
40 Bottom electrode
42 End
44 Top electrode
46 End
50 External electrode
60 Plating layer
62 Plating layer
64 End
66 End
70 Insulation layer
72 End
74 Insulation layer
80 Circuit board
82 Electrode
84 Solder
90 Electrode paste 92 Barrel
94 Cracking
96 Insulation layer
100 to 700 Coil component
800 Capacitor component
900 Electronic apparatus

DETAILED DESCRIPTION OF EMBODIMENTS

Examples of the present invention are explained below by referring to the drawings.

Example 1

Figure 1B:
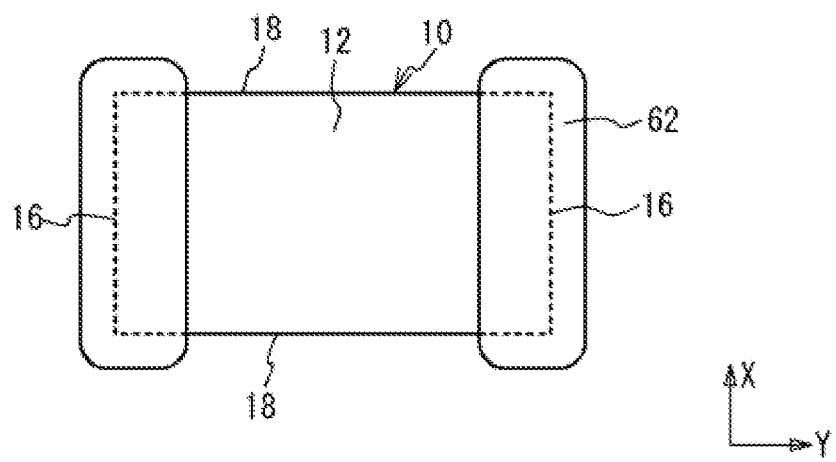
FIG. 1B is a top view of the coil component.
Figure 1C:
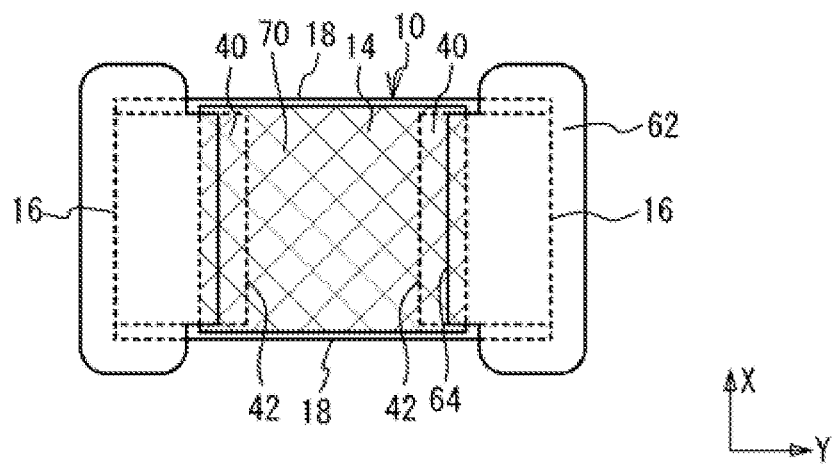
FIG. 1C is a bottom view of the coil component.

FIG. 1A is a cross-sectional view of the coil component 100 pertaining to Example 1, FIG. 1B is a top view of the coil component 100, and FIG. 1C is a bottom view of the coil component 100. As shown in FIGS. 1A through 1C, the coil component 100 in Example 1 comprises an insulator part 10, a coil element 32, a first metal layer (bottom electrode 40), a third metal layer (plating layer 60), and a second metal layer (plating layer 62). The first metal layer is not necessarily provided on the bottom face of the insulator part alone, but since a component and a circuit board are normally joined at the bottom face of the component, it is referred to as "bottom electrode 40" in the following explanations. Similarly, the second metal layer and third metal layer are not necessarily formed by means of plating and can also be formed by coating, sputtering, etc.; since these metal layers are generally formed by plating, however, they are referred to as "plating layer 62" and "plating layer 60," respectively, in the following explanations.

The insulator part 10 constitutes a rectangular solid shape having a top face 12, a bottom face 14, a pair of end faces 16, and a pair of side faces 18, as well as width-direction sides in the X-axis direction, length-direction sides in the Y-axis direction and height-direction sides in the Z-axis direction. The bottom face 14 is a mounting face, while the top face 12 is a face opposite the bottom face 14. The end faces 16 are connected to the pair of sides (such as short sides) of the top face 12 and bottom face 14, while the side faces 18 are connected to the pair of sides (such as long sides) of the top face 12 and bottom face 14. The insulator part 10 is formed by an insulating material whose primary component is glass, or magnetic material such as ferrite, for example. The insulator part 10 has a width dimension of 0.05 to 0.3 mm, a length dimension of 0.1 mm to 0.6 mm, and a height dimension of 0.05 mm to 0.5 mm, for example. It should be noted that the insulator part 10 is not limited to a perfect rectangular solid shape; instead, it may have rounded vertexes, rounded ridges (boundaries between the faces), or curved faces, for example.

The coil element 32 is provided inside the insulator part 10. The coil element 32 is formed by a spirally linked conductor 30 provided inside the insulator part 10. The coil element 32 has prescribed winding units, and a coil axis running roughly at right angles with the surfaces specified by the winding units. The conductor 30 is formed by copper, aluminum, nickel, silver, platinum, palladium, or other metal material, or alloyed metal material containing any of the foregoing, for example.

Figure 2A:
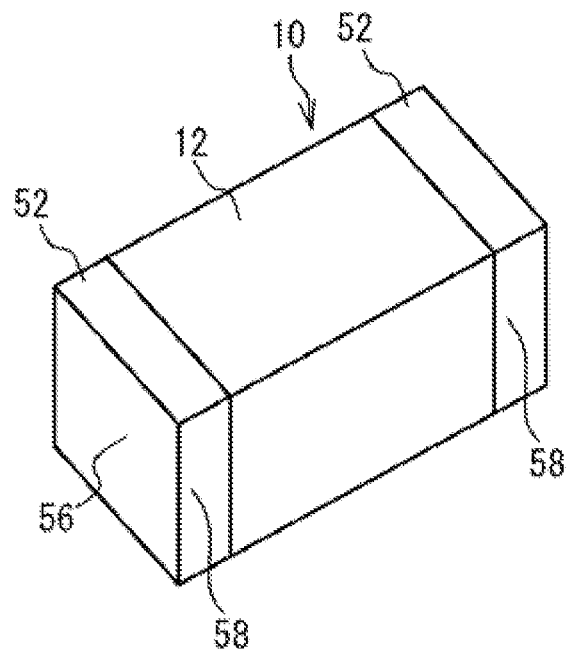
FIGS. 2A and 2B are perspective views explaining the external electrodes.
Figure 2B:
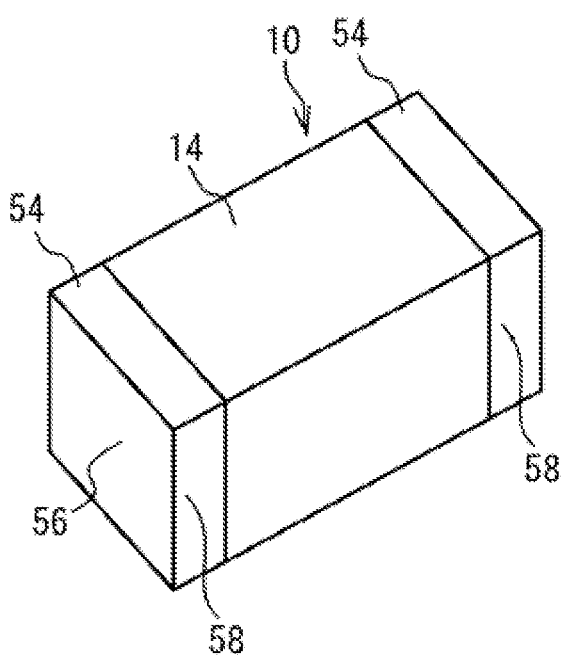

The bottom electrodes 40 are provided on the bottom face 14 of the insulator part 10 close to the end face 16 sides. On the insulator part 10, external electrodes 50 contacting the bottom electrodes 40 are provided. Here, the external electrodes 50 are explained using FIGS. 2A and 2B. FIGS. 2A and 2B are perspective views explaining the external electrodes 50. FIG. 2A is a perspective view from the top face 12 side, while FIG. 2B is a perspective view from the bottom face 14 side, of the insulator part 10. As shown in FIGS. 2A and 2B, each external electrode 50 includes a top part 52 provided on the top face 12, a bottom part 54 provided on the bottom face 14 and contacting the bottom electrode 40, an end part 56 provided on the end face 16, and a side part 58 provided on the side face 18, of the insulator part 10.

As shown in FIGS. 1A through 1C, the external electrodes 50 are connected to the conductor 30 via lead-out conductors 34 provided inside the insulator part 10. As a result, the bottom electrodes 40 and external electrodes 50 are electrically connected to the coil element 32. The lead-out conductors 34 are formed by the same material as the conductor 30, for example. The bottom electrodes 40 and external electrodes 50 are formed by copper, aluminum, nickel, silver, platinum, palladium, or other metal material, or alloyed metal material containing any of the foregoing, for example. The bottom electrodes 40 and the external electrodes 50 may be formed by the same metal material or by different metal materials.

An insulation layer 70 is provided, covering the ends 42 of the bottom electrodes 40 and the area of the bottom face 14 of the insulator part 10 where the bottom electrodes 40 are not provided. The insulation layer 70 extends from one to the other of the pair of bottom electrodes 40, in a manner covering the bottom face 14 of the insulator part 10. The insulation layer 70 is formed by an insulating material whose primary component is glass, or magnetic material such as ferrite, or resin material, for example, and has lower solder wettability than the plating layer 62. The insulation layer 70 may be formed by the same material as the insulator part 10, or a different material.

The plating layer 60 is provided in a manner covering each bottom electrode 40 and each external electrode 50. The plating layer 60 contacts the end 72 of the insulation layer 70 at its end 68 on the bottom face 14 of the insulator part 10, and is not provided near the end 42 of the bottom electrode 40. The plating layer 62 is provided in a manner covering the plating layer 60. The plating layer 60 is constituted by a metal having lower solder wettability and whose melting point is higher, than the plating layer 62. The plating layer 60 is a nickel plating layer, for example, while the plating layer 62 is a tin plating layer, for example. The plating layer 60 is provided to prevent the bottom electrode 40 and external electrode 50 from diffusing to the solder that sticks to the surface of the plating layer 62 (i.e., preventing solder leaching).

The end 64 of the plating layer 62 on the bottom face 14 of the insulator part 10 is away from the end 42 of the bottom electrode 40 and overlaps the bottom electrode 40. The spacing X between the end 64 of the plating layer 62 and the end 42 of the bottom electrode 40 is 3 μm or more, for example. Also, the plating layer 62 is formed in a manner covering the end 72 of the insulation layer 70. In other words, the end 72 of the insulation layer 70 is sandwiched between the bottom electrode 40 and the plating layer 62, while the end 64 of the plating layer 62 overlaps the bottom electrode 40 via the insulation layer 70.

FIGS. 3, 4A through 4C, 5A, and 5B are drawings illustrating how the coil component 100 pertaining to Example 1 is manufactured. The coil component 100 is formed according to a process that includes a step to stack green sheets made of insulating material. A green sheet is a precursor to the insulation layer which will constitute the insulator part 10, and is formed by coating onto a film using the doctor blade method, etc., an insulating material slurry whose primary ingredient is glass, etc., for example. It should be noted that, instead of an insulating material whose primary component is glass, a magnetic body using ferrite, etc., may also be used. The thickness of the green sheet is not limited in any way, and may be in a range of 5 to 60 μm, such as 20 μm, for example.

Figure 3:
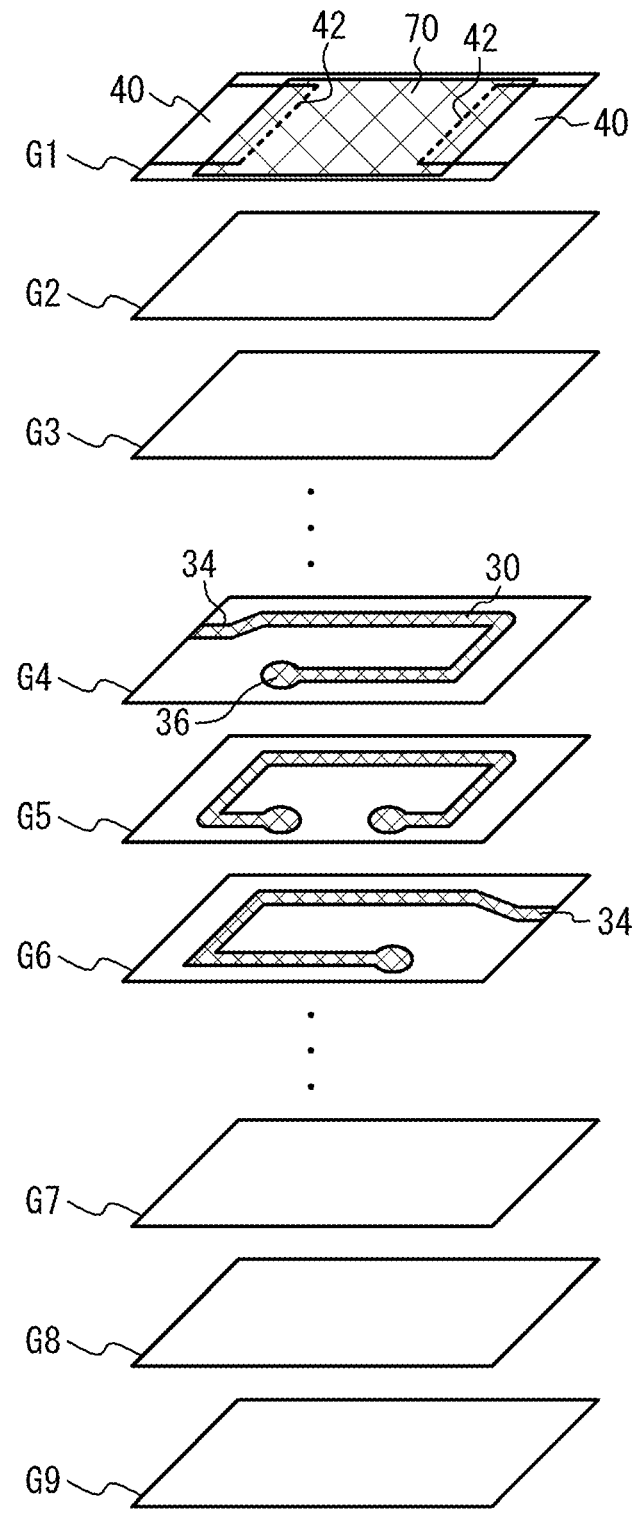
FIG. 3 is a drawing illustrating how the coil component pertaining to Example 1 is manufactured (Part 1).

As shown in FIG. 3, multiple green sheets G1 to G9 are prepared. A conductive material is printed (such as screen-printed) onto the surface of the green sheet G1, to form the bottom electrodes 40. Next, an insulating material is printed onto the surface of the green sheet G1, to form the insulation layer 70 that extends from one bottom electrode 40 to the other in a manner covering the surface of the green sheet G1. The insulation layer 70 is formed in a manner covering the end 42 of each bottom electrode 40, so that when the plating layer 62 is formed as described below, the formed end 64 of the plating layer 62 will be away from the end 42 of the bottom electrode 40 by 3 μm or more.

Through holes are formed in the green sheets G4, G5 at prescribed positions using laser processing, etc. Next, a conductive material is printed onto the green sheets G4 to G6 to form precursors to the conductor 30, lead-out conductors 34, and via hole conductors 36. These precursors will become the conductor 30, lead-out conductors 34, and via hole conductors 36 when sintered.

The green sheets G1 to G9 are stacked in a prescribed order, after which pressure is applied in the stacking direction to pressure-bond the green sheets G1 to G9. Then, the pressure-bonded green sheets G1 to G9 are cut to individual chips, and then sintered at a prescribed temperature (approx. 700 to 900° C., for example), to form the insulator bodies 10.

Figure 4A:
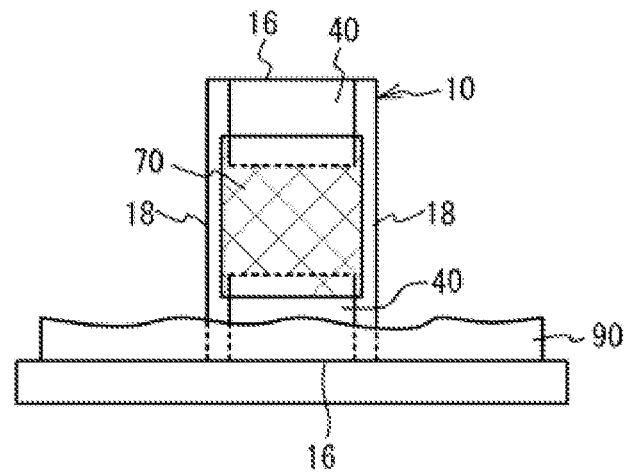
FIGS. 4A through 4C are drawings illustrating how the coil component pertaining to Example 1 is manufactured (Part 2).
Figure 4B:
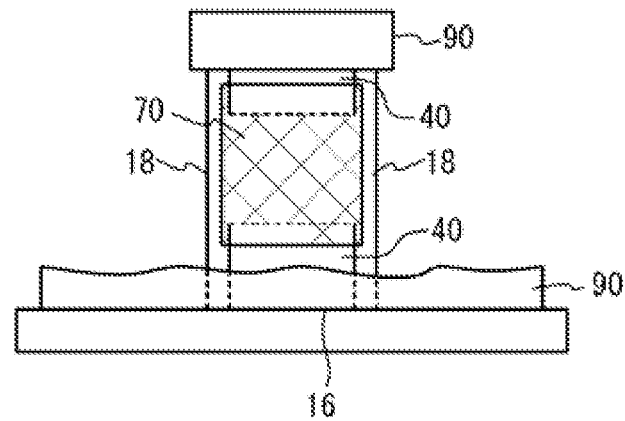
Figure 4C:
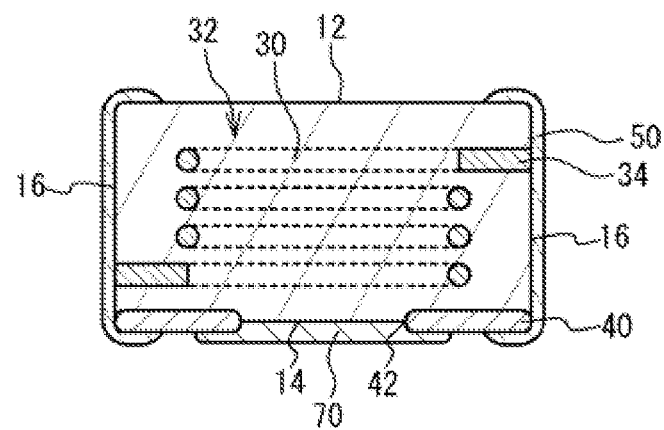

As shown in FIG. 4A, one end face 16 side of each insulator part 10 is immersed in an electrode paste 90 to be coated with the electrode paste 90, after which the coated electrode paste 90 is dried. As shown in FIG. 4B, the other end face 16 side of the insulator part 10 is immersed in the electrode paste 90 to be coated with the electrode paste 90, after which the coated electrode paste 90 is dried. This is followed by baking at a prescribed temperature (approx. 500 to 700° C., for example). This way, as shown in FIG. 4C, the external electrodes 50 contacting the bottom electrodes 40 are formed on the insulator part 10. The external electrodes 50 are connected to the conductor 30 via the lead-out conductors 34. As a result, the bottom electrodes 40 and external electrodes 50 are electrically connected to the coil element 32.

Figure 5A:
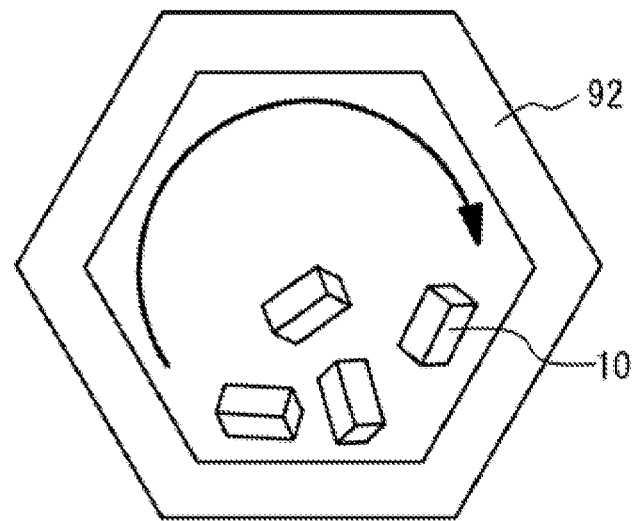
FIGS. 5A and 5B are drawings illustrating how the coil component pertaining to Example 1 is manufactured (Part 3).
Figure 5B:
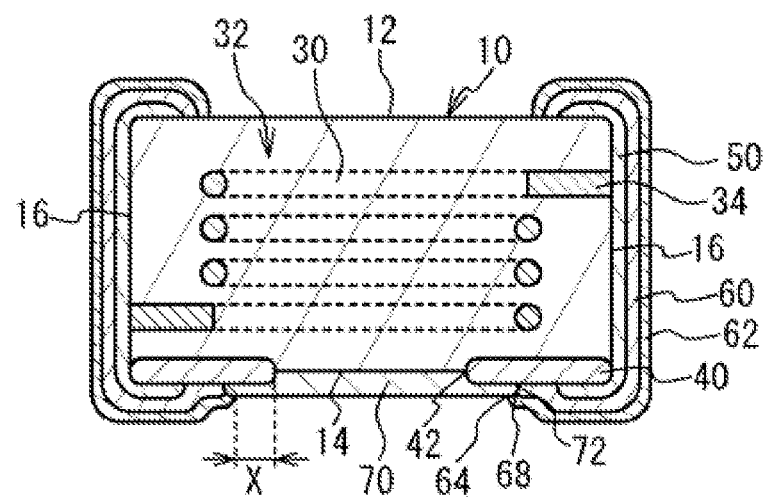

As shown in FIG. 5A, the insulator part 10 is introduced into a barrel 92, and the insulator part 10 is plated using the barrel plating method. This way, the plating layer 60 covering the bottom electrodes 40 and external electrodes 50, and the plating layer 62 covering the plating layer 60, are formed, as shown in FIG. 5B. The plating layer 60 is formed by a plating process where the insulation layer 70 is used as a mask, so its end 68 is formed in contact with the end 72 of the insulation layer 70. The plating layer 62 is also formed by a plating process where the insulation layer 70 is used as a mask, but the plating layer 62 is formed in a manner covering the plating layer 60, so its end 64 is formed by overlapping the insulation layer 70. Also, as described above, the insulation layer 70 is formed in a manner covering the end 42 of the bottom electrode 40 so that the formed end 64 of the plating layer 62 is away from the end 42 of the bottom electrode 40 by 3 μm or more; accordingly, the spacing X between the end 64 of the plating layer 62 and the end 42 of the bottom electrode 40 becomes 3 μm or more.

Figure 6:
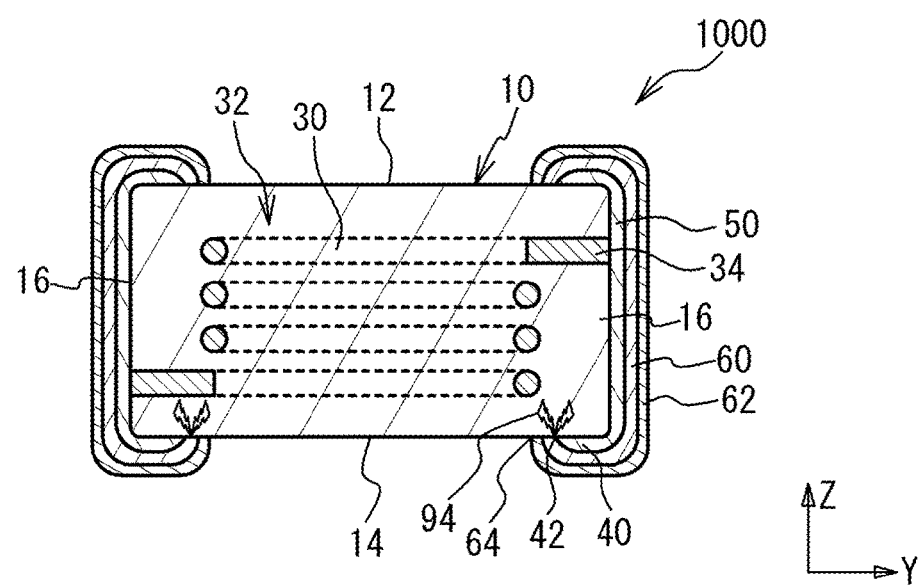
FIG. 6 is a cross-sectional view of the coil component pertaining to Comparative Example 1.

FIG. 6 is a cross-sectional view of the coil component 1000 pertaining to Comparative Example 1. As shown in FIG. 6, the coil component 1000 in Comparative Example 1 has its bottom electrodes 40 formed by the external electrodes 50 provided on the surface of the insulator part 10. The plating layer 60 is formed in a manner covering the entire external electrode 50. As a result, the end 42 of the bottom electrode 40 is covered by the plating layer 60. The plating layer 62 is formed in a manner covering the entire plating layer 60. Therefore, the end 64 of the plating layer 62 is positioned on the bottom face 14 of the insulator part 10 near the end 42 of the bottom electrode 40.

When its plating layer 62 is soldered to a circuit board in order to mount the coil component 1000 in Comparative Example 1 on the circuit board, the solder wets and spreads over the entire plating layer 62 on the bottom face 14 of the insulator part 10. The mounted coil component 1000 may receive stress due to warping of the circuit board, etc., in which case this stress tends to concentrate near the end 64 of the plating layer 62 soldered to the circuit board. Since the end 64 of the plating layer 62 is formed on the bottom face 14 of the insulator part 10 at a position near the end 42 of the bottom electrode 40, cracking 94 may generate in the insulator part 10 near the end 42 of the bottom electrode 40.

According to Example 1, on the other hand, the end 64 of the plating layer 62 is provided in a manner overlapping the bottom electrode 40 away from the end 42 of the bottom electrode 40, as shown in FIG. 1A. Since the end 64 of the plating layer 62 is in contact with the insulation layer 70 whose solder wettability is lower than that of the plating layer 62, the solder does not spread from the plating layer 62 toward the insulation layer 70, and consequently the stress concentrates near the end 64 of the plating layer 62. However, because the end 64 of the plating layer 62 is provided in a manner overlapping the bottom electrode 40, the stress is absorbed by the bottom electrode 40 whose hardness is lower and spreadability is higher than that of the insulator part 10, and therefore any effect on the insulator part 10 is suppressed. Accordingly, generation of cracking in the insulator part 10, such as the cracking 94 in Comparative Example 1, can be prevented.

Also, according to Example 1, the end 64 of the plating layer 62 overlaps the bottom electrode 40 via the insulation layer 70, as shown in FIG. 1A. Because the end 64 of the plating layer 62 overlaps the insulation layer 70, any stress applied to the plating layer 62 can be diffused to the insulation layer 70. This prevents generation of cracking in the insulator part 10. Also, the insulation layer 70 extends from one bottom electrode 40 to the other in a manner covering the bottom face 14 of the insulator part 10, which prevents the stress diffused to the insulation layer 70 from concentrating at one part of the insulator part 10. This, too, helps prevent generation of cracking in the insulator part 10.

Preferably the end 64 of the plating layer 62 is away from the end 42 of the bottom electrode 40 by 3 μm or more. This is explained based on the experiment conducted by the inventors. The inventors prepared multiple samples, each having a different length of spacing X between the end 64 of the plating layer 62 and the end 42 of the bottom electrode 40, and conducted a board flex test. In the board flex test, each sample was mounted onto the top face of a mounting board via solder and a force was applied from the bottom face of the mounting board to deflect the mounting board, to test whether or not cracking generated in the sample. Each sample used in the board flex test had a size of 0.2 mm in width, 0.4 mm in length, and 0.2 mm in height. Also, the insulator part 10 was formed by an insulating material whose primary component was glass, the bottom electrode 40 was formed by a metal material whose primary component was silver, the plating layer 60 was provided as a nickel plating layer, and the plating layer 62 was provided as a tin plating layer.

Table 1 shows the test results with the mounting board deflected by 3 mm. It should be noted that, in Table 1, a positive value of spacing X indicates that the end 42 of the bottom electrode 40 projects beyond the end 64 of the plating layer 62, as shown in FIG. 1A; on the other hand, a negative value of spacing X indicates that the end 64 of the plating layer 62 projects beyond the end 42 of the bottom electrode 40.

TABLE 1

| Spacing X between the plating layer and the bottom electrode | −10 μm | −5 μm | 0 μm | 2 μm | 3 μm | 5 μm | 10 μm | 15 μm |
|---|---|---|---|---|---|---|---|---|
| Cracked samples/ Tested samples | 17/30 | 15/30 | 5/30 | 1/30 | 0/30 | 0/30 | 0/30 | 0/30 |

As shown in Table 1, cracking 94 generated in the insulator part 10 on 17 out of the 30 chips whose spacing X between the end 64 of the plating layer 62 and the end 42 of the bottom electrode 40 was −10 μm. Cracking 94 generated on 15 out of the 30 chips whose spacing X was −5 μm, on 5 out of the 30 chips whose spacing X was 0 μm, and on 1 out of the 30 chips whose spacing X was 2 μm. On the other hand, cracking did not generate in the insulator part 10 on any of the 30 chips whose spacing X was 3 μm, 5 μm, 10 μm, or 15 μm.

The absence of cracking at a spacing X of 3 μm, 5 μm, 10 μm, or 15 μm is probably explained by the reason described above. To be specific, because the end 64 of the plating layer 62 is positioned by overlapping the bottom electrode 40, any stress concentrating at the end 64 of the plating layer 62 due to deflection is absorbed by the bottom electrode 40 whose hardness is lower and spreadability is higher than that of the insulator part 10, and any effect on the insulator part 10 is suppressed, as a result. This probably prevents generation of cracking in the insulator part 10. Also, the generation of cracking 94 at a spacing X of 2 μm is probably explained by the positioning of the end 64 of the plating layer 62 near the end 42 of the bottom electrode 40, which caused the stress concentrating at the end 64 of the plating layer 62 to also affect the end 42 of the bottom electrode 40 and consequently led to the generation of cracking 94 in the insulator part 10. It should be noted that similar results will likely be obtained when the size of the sample, material and thickness of each of its constituents, etc., are changed. It should also be noted that the hardness of the insulator part 10 and that of the bottom electrode 40 can be measured in Vickers hardness or Macro Vickers hardness, for example, or using any other measurement method.

Based on these experimental results, preferably the end 64 of the plating layer 62 is provided away from the end 42 of the bottom electrode 40 by 3 μm or more, from the viewpoint of effectively preventing the generation of cracking in the insulator part 10.

From the viewpoint of preventing the generation of cracking in the insulator part 10, the spacing X between the end 64 of the plating layer 62 and the end 42 of the bottom electrode 40 is preferably 5 μm or more, or more preferably 10 μm or more, or even more preferably 15 μm or more. From the viewpoint of preventing the connecting area of the plating layer 62 with the circuit board from decreasing, on the other hand, the spacing X between the end 64 of the plating layer 62 and the end 42 of the bottom electrode 40 is preferably 15 μm or less, or more preferably 10 μm or less, or even more preferably 5 μm or less.

Also, according to Example 1, the coil element 32 is formed inside the insulator part 10, and the bottom electrodes 40 electrically connected to the coil element 32 are formed on the bottom face 14 of the insulator part 10, as explained in FIGS. 3 and 4A through 4C. The insulation layer 70 covering the ends 42 of the bottom electrodes 40 is formed on the bottom face 14 of the insulator part 10. As explained using FIGS. 5A and 5B, the plating layer 60 covering the bottom electrodes 40, and the plating layer 62 covering the plating layer 60, are formed using the insulation layer 70 as a mask. The coil component 100 formed according to this manufacturing method allows any stress applied to the plating layer 62 and concentrating near the end 64 to be absorbed by the bottom electrode 40, and therefore generation of cracking in the insulator part 10 can be prevented.

Also, as explained using FIG. 3, preferably when the insulation layer 70 is formed, the insulation layer 70 is formed in a manner covering the end 42 of each bottom electrode 40 so that the formed end 64 of the plating layer 62 will be away from the end 42 of the bottom electrode 40 by 3 μm or more. This way, generation of cracking in the insulator part 10 can effectively be prevented, as explained using Table 1.

Figure 7A:
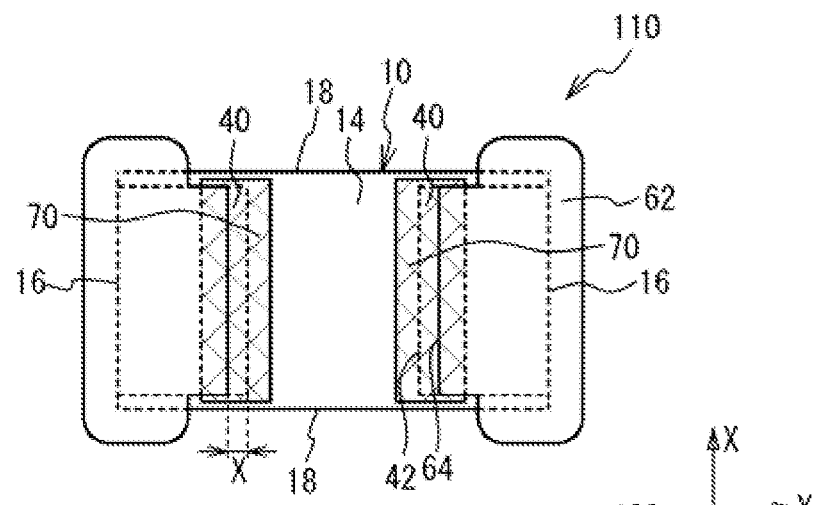
FIGS. 7A through 7C are bottom views of the coil components pertaining to Variation Examples 1 through 3 of Example 1.
Figure 7B:
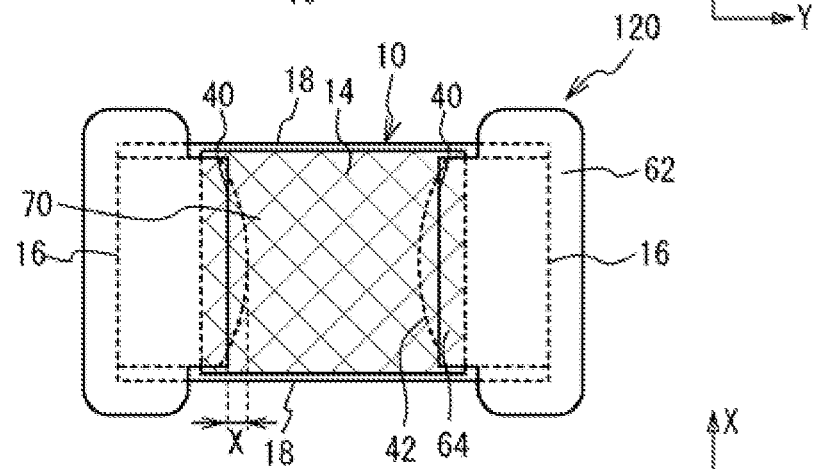
Figure 7C:
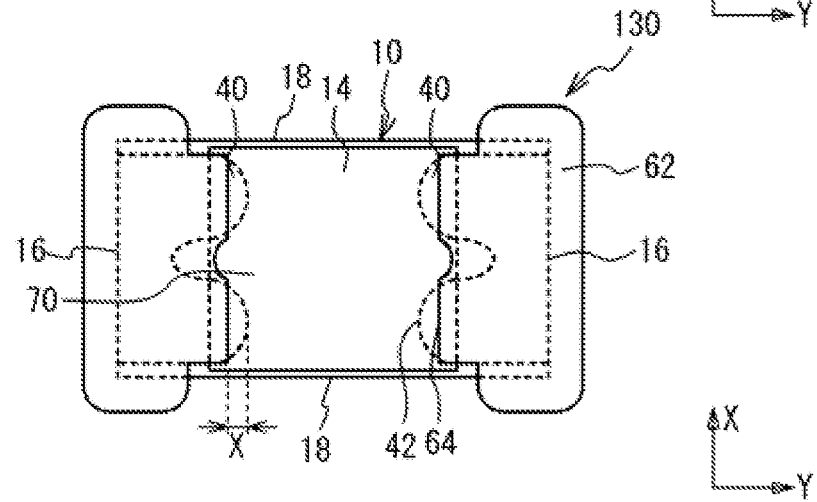

FIGS. 7A through 7C are bottom views of the coil component 110 pertaining to Variation Example 1, through the coil component 130 pertaining to Variation Example 3, of Example 1. Like the coil component 110 pertaining to Variation Example 1 as shown in FIG. 7A, the insulation layer 70 provided on the bottom face 14 of the insulator part 10 may have a break in the middle, instead of extending from one to the other of the pair of bottom electrodes 40. Like the coil component 120 pertaining to Variation Example 2 as shown in FIG. 7B, and the coil component 130 pertaining to Variation Example 3 as shown in FIG. 7C, the shape of the end 42 of the bottom electrode 40 on a plan view of the bottom face 14 of the insulator part 10 is not limited to a linear shape, and it may be a curved shape. When having a curved shape, the end 42 of the bottom electrode 40 is longer than when it has a linear shape, which makes it easy to diffuse stress. When the end 42 of the bottom electrode 40 has a curved shape, stress tends to concentrate at the tip projecting most, and consequently the spacing X between the end 64 of the plating layer 62 and the end 42 of the bottom electrode 40 represents the spacing between the tip of the bottom electrode 40 projecting most and the corresponding end 64 of the plating layer 62.

Example 2

Figure 8A:
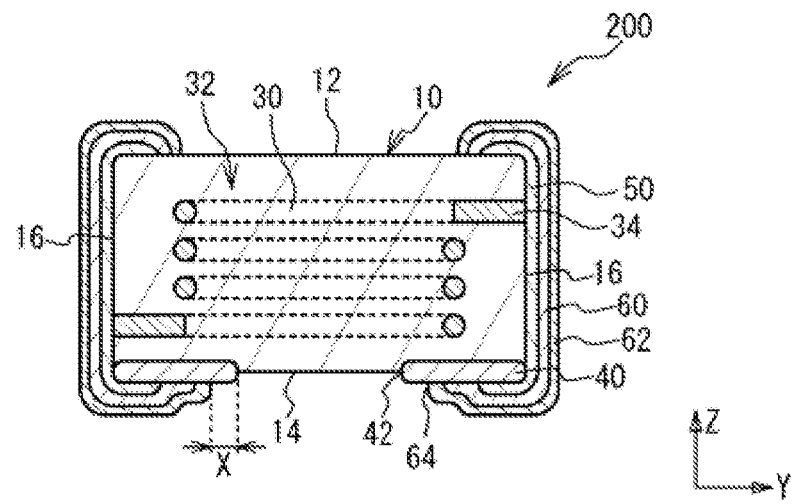
FIG. 8A is a cross-sectional view of the coil component pertaining to Example 2.
Figure 8B:
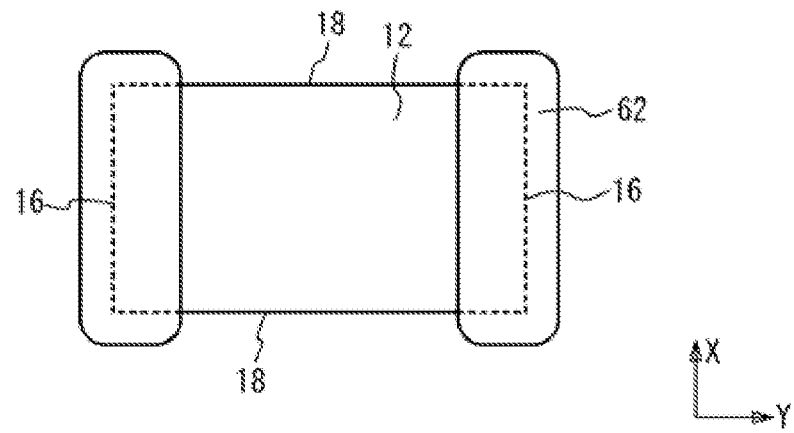
FIG. 8B is a top view of the coil component.
Figure 8C:
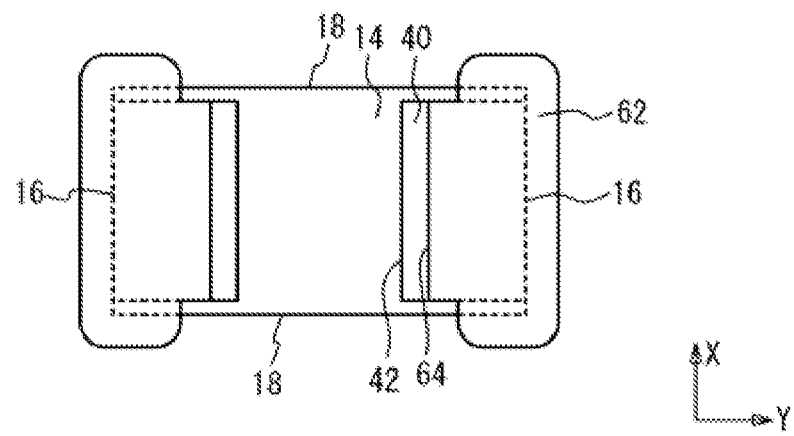
FIG. 8C is a bottom view of the coil component.

FIG. 8A is a cross-sectional view of the coil component 200, FIG. 8B is a top view of the coil component 200, and FIG. 8C is a bottom view of the coil component 200, pertaining to Example 2. As shown in FIGS. 8A through 8C, the coil component 200 pertaining to Example 2 has no insulation layer 70 provided on the bottom face 14 of the insulator part 10. The bottom electrode 40 is constituted by a metal having lower solder wettability and whose melting point is higher, than the plating layer 62; for example, it is formed by nickel. In other words, the plating layer 62 is constituted by a metal having higher solder wettability and whose melting point is lower, than the bottom electrode 40. The remaining constitutions are the same as those in Example 1 and therefore are not explained.

Figure 9A:
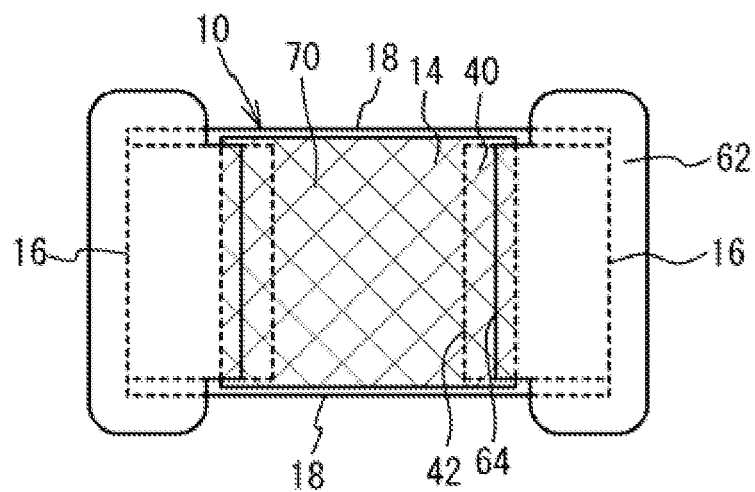
FIGS. 9A and 9B are drawings illustrating how the coil component pertaining to Example 2 is manufactured.
Figure 9B:
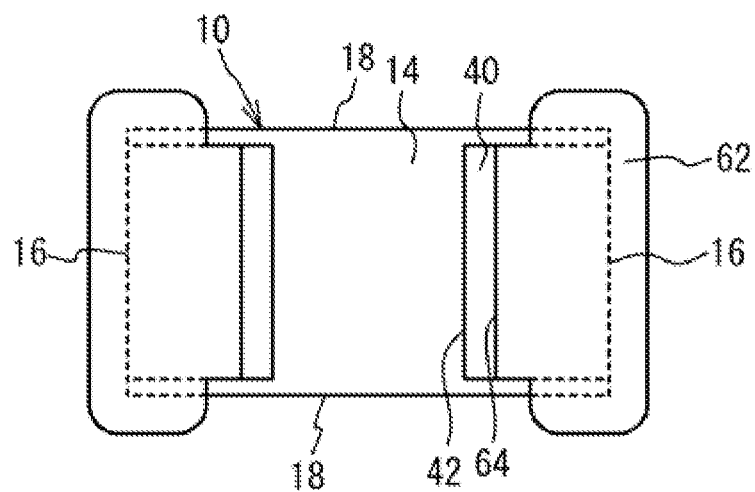

FIGS. 9A and 9B are drawings illustrating how the coil component 200 pertaining to Example 2 is manufactured. First, the manufacturing process explained in FIGS. 3, 4A through 4C, 5A, and 5B in Example 1 is implemented. As a result of this, the insulation layer 70 covering the ends 42 of the bottom electrodes 40 is formed and the plating layer 62 is formed on the exterior side of the insulation layer 70, on the bottom face 14 of the insulator part 10, as shown in FIG. 9A. As shown in FIG. 9B, the insulation layer 70 is peeled off. This way, the coil component 200 in Example 2 is formed.

According to Example 2, the end 42 of the bottom electrode 40 is not covered by the plating layer 60, and the bottom electrode 40 is constituted by a metal having lower solder wettability and whose melting point is higher, than the plating layer 62. Because the solder wettability of the bottom electrode 40 is lower than that of the plating layer 62, the solder does not easily wet and spread from the plating layer 62 toward the bottom electrode 40 even when the plating layer 62 is soldered. When stress is applied to the plating layer 62, therefore, the stress concentrates near the end 64 of the plating layer 62 provided by overlapping the bottom electrode 40. Accordingly, the stress concentrating at the end 64 of the plating layer 62 is absorbed by the bottom electrode 40, and generation of cracking in the insulator part 10 can be prevented as a result. Also, mounting the coil component 200 onto a circuit board causes the insulator part 10 to remain away from the circuit board by the thickness of the plating layer 60, which improves the ease of washing the bottom face 14 of the insulator part 10 and thus prevents the generation of cracking in the mold resin caused by solder flashing. Also, entry of the mold resin onto the bottom face 14 side of the insulator part 10 is facilitated.

It should be noted that, while the bottom electrode 40 is formed by nickel in Example 2, it may be formed by any other metal so long as it is constituted by a metal having lower solder wettability and whose melting point is higher, than the plating layer 62.

Example 3

Figure 10A:
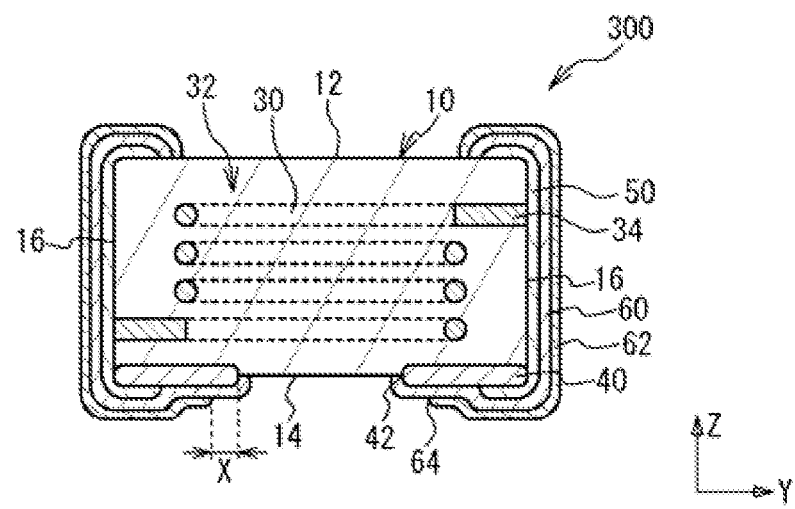
FIG. 10A is a cross-sectional view of the coil component pertaining to Example 3.
Figure 10B:
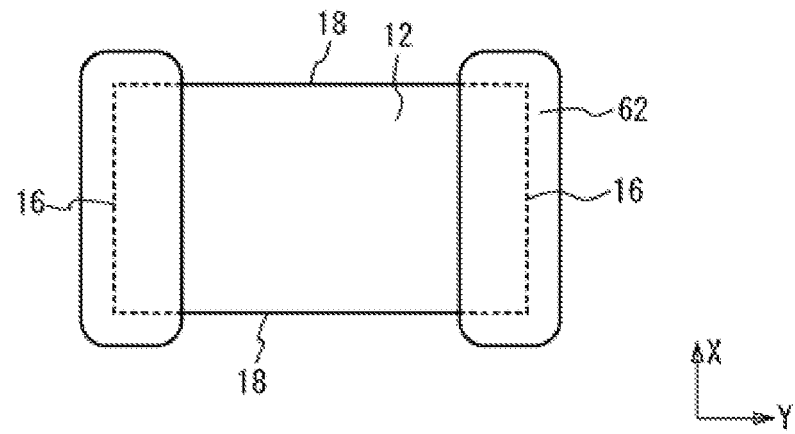
FIG. 10B is a top view of the coil component.
Figure 10C:
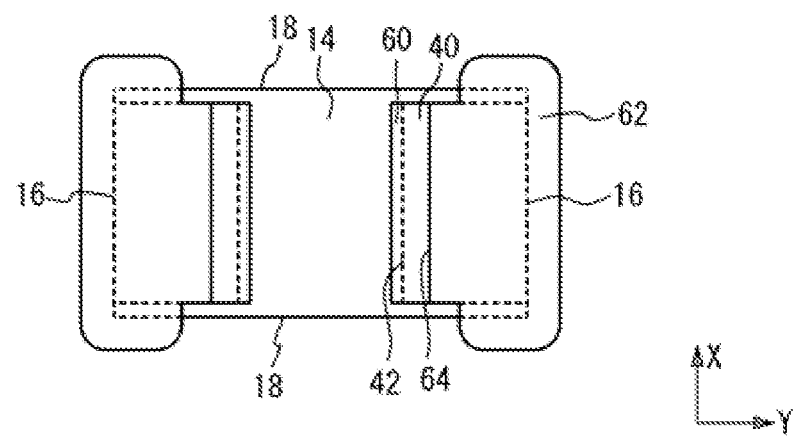
FIG. 10C is a bottom view of the coil component.

FIG. 10A is a cross-sectional view of the coil component 300, FIG. 10B is a top view of the coil component 300, and FIG. 10C is a bottom view of the coil component 300, pertaining to Example 3. As shown in FIGS. 10A through 10C, the coil component 300 pertaining to Example 3 has no insulation layer 70 provided on the bottom face 14 of the insulator part 10, and the plating layer 60 covers the entire bottom electrode 40 including its end 42. The remaining constitutions are the same as those in Example 1 and therefore are not explained.

Figure 11:
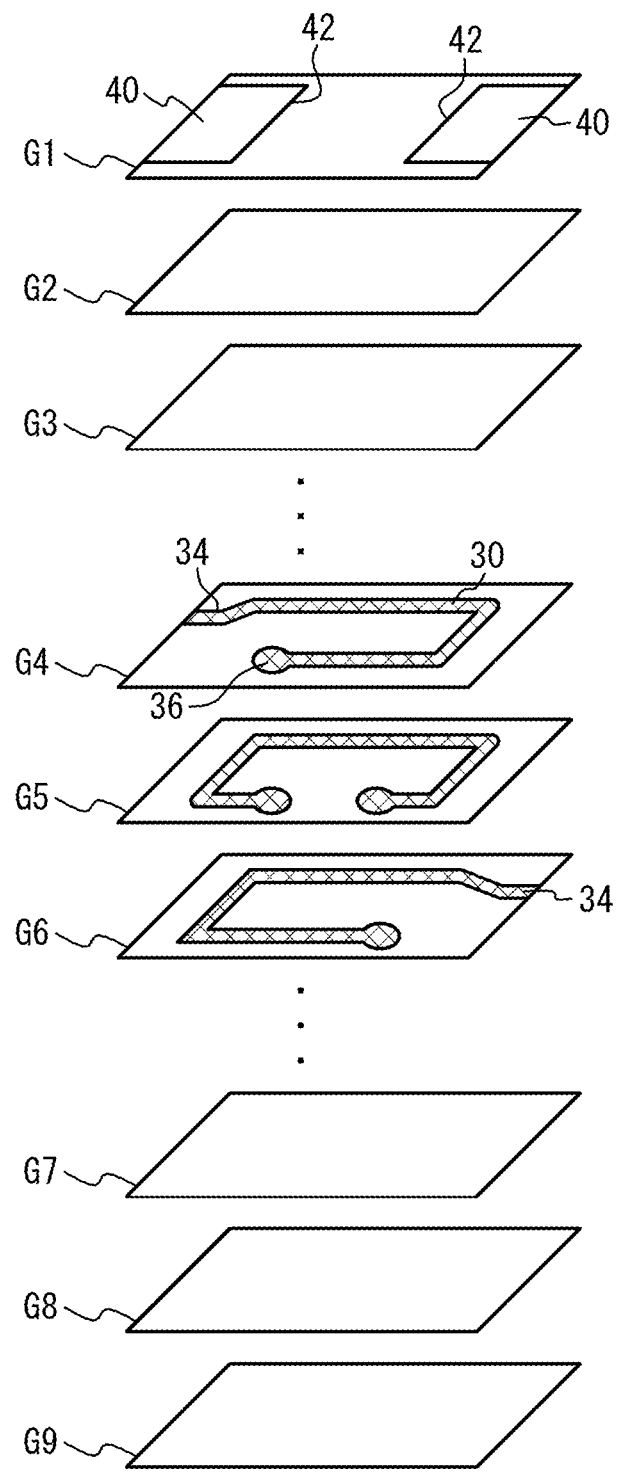
FIG. 11 is a drawing illustrating how the coil component pertaining to Example 3 is manufactured (Part 1).

FIGS. 11, 12A through 12C, 13A, and 13B are drawings illustrating how the coil component 300 pertaining to Example 3 is manufactured. As shown in FIG. 11, multiple green sheets G1 to G9 are prepared. The difference from FIG. 3 in Example 1 is that only the bottom electrodes 40 are formed on the surface of the green sheet G1 and no insulation layer 70 is formed. Except for this point, the same processing explained using FIG. 3 in Example 1 is performed.

Figure 12A:
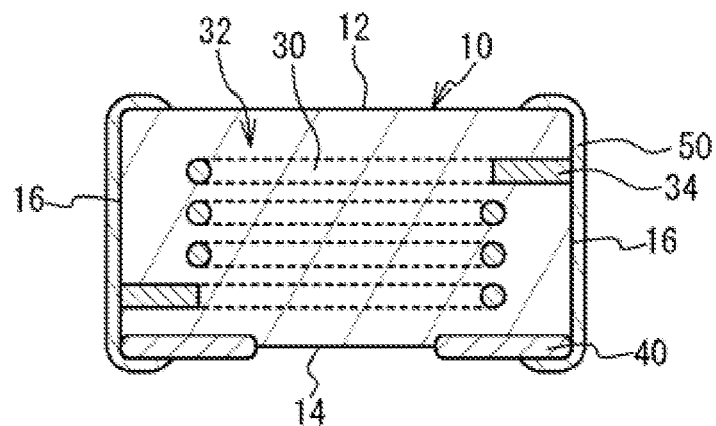
FIGS. 12A through 12C are drawings illustrating how the coil component pertaining to Example 3 is manufactured (Part 2).
Figure 12B:
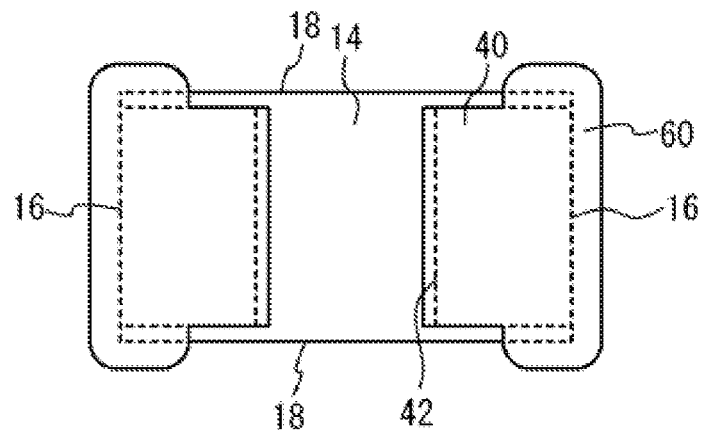
Figure 12C:
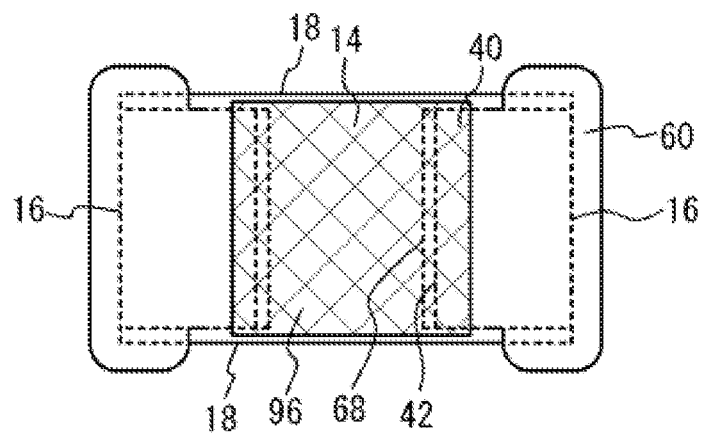

Next, the processing explained using FIGS. 4A and 4B in Example 1 is performed to form, on the insulator part 10, the external electrodes 50 contacting the bottom electrodes 40, as shown in FIG. 12A. Next, the barrel plating method explained using FIG. 5A in Example 1 is used to plate the insulator part 10, to form the plating layer 60 covering the bottom electrodes 40 and external electrodes 50, as shown in FIG. 12B. Next, as shown in FIG. 12C, the insulation layer 96 covering the plating layer 60 is formed on the bottom face 14 of the insulator part 10 by means of coating, in a manner covering the ends 42 of the bottom electrodes 40. The insulation layer 96 is a resist film, for example. The insulation layer 96 is formed in a manner covering the plating layer 60 so that, when the plating layer 62 is formed as described below, the formed end 64 of the plating layer 62 will be away from the end 42 of the bottom electrode 40 by 3 μm or more.

Figure 13A:
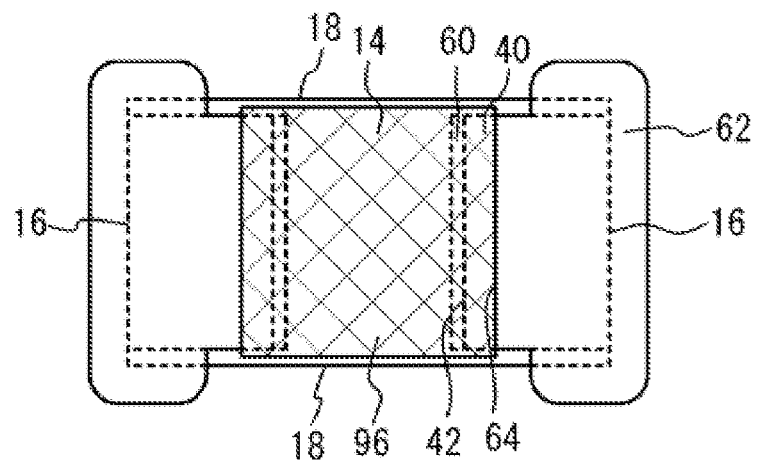
FIGS. 13A and 13B are drawings illustrating how the coil component pertaining to Example 3 is manufactured (Part 3).
Figure 13B:
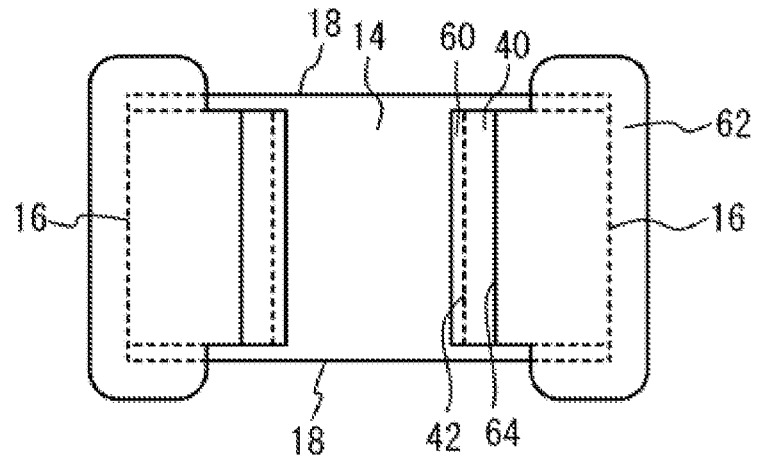

After the insulation layer 96 has been formed, the barrel plating method explained using FIG. 5A in Example 1 is used to plate the insulator part 10, to form the plating layer 62 covering the plating layer 60, as shown in FIG. 13A. Next, as shown in FIG. 13B, the insulation layer 96 is peeled off. Since the insulation layer 96 used as a mask in the formation of the plating layer 62 has been formed in a manner covering the plating layer 60 so that the formed end 64 of the plating layer 62 is away from the end 42 of the bottom electrode 40 by 3 μm or more, the spacing X between the end 64 of the plating layer 62 and the end 42 of the bottom electrode 40 becomes 3 μm or more.

According to Example 3, the plating layer 60 is provided in a manner covering the entire bottom electrode 40 including its end 42. Because the plating layer 60 is constituted by a metal having lower solder wettability and whose melting point is higher, than the plating layer 62, the solder does not easily wet and spread from the plating layer 62 toward the plating layer 60 even when the plating layer 62 is soldered. Accordingly, generation of cracking in the insulator part 10 can be prevented, as in Example 2.

Also, according to Example 3, the coil element 32 is formed inside the insulator part 10, and the bottom electrodes 40 electrically connected to the coil element 32 are formed on the bottom face 14 of the insulator part 10, as explained using FIGS. 11 and 12A. As explained using FIG. 12B, the plating layer 60 covering the bottom electrodes 40 is formed. As explained using FIG. 12C, the insulation layer 96 covering the plating layer 60 is formed, on the bottom face 14 of the insulator part 10, in a manner covering the ends 42 of the bottom electrodes 40. As explained using FIG. 13A, the plating layer 62 covering the plating layer 60 is formed using the insulation layer 96 as a mask. The coil component 300 formed by this manufacturing method can prevent generation of cracking in the insulator part 10. Also, because the plating layer 62 is formed using the insulation layer 96 as a mask, the end 64 of the plating layer 62 tends to be formed as linear, which increases the self-alignment effect when the component is mounted onto a circuit board. Also, the ends 64 of the pair of plating layers 62 can easily be adjusted to almost the same length, and thus the Manhattan phenomenon can be prevented.

Also, as explained using FIG. 12C, preferably when the insulation layer 96 is formed, the insulation layer 96 is formed in a manner covering the plating layer 60 so that the formed end 64 of the plating layer 62 is away from the end 42 of the bottom electrode 40 by 3 μm or more. This way, generation of cracking in the insulator part 10 can be effectively prevented, as explained using Table 1.

It should be noted that the plating layer 60 is not limited to a nickel plating layer, and may be other metal plating layer, or a non-plating metal layer, so long as it is constituted by a metal having lower solder wettability and whose melting point is higher, than the plating layer 62.

Example 4

Figure 14A:
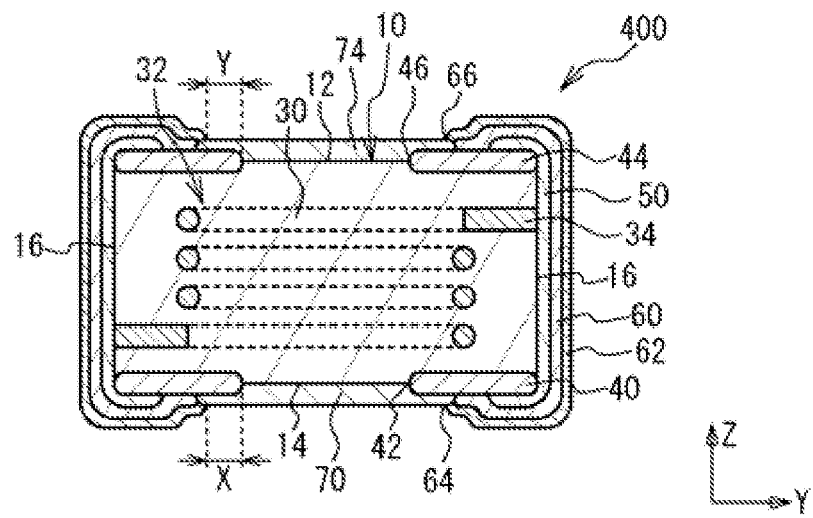
FIG. 14A is a cross-sectional view of the coil component pertaining to Example 4.
Figure 14B:
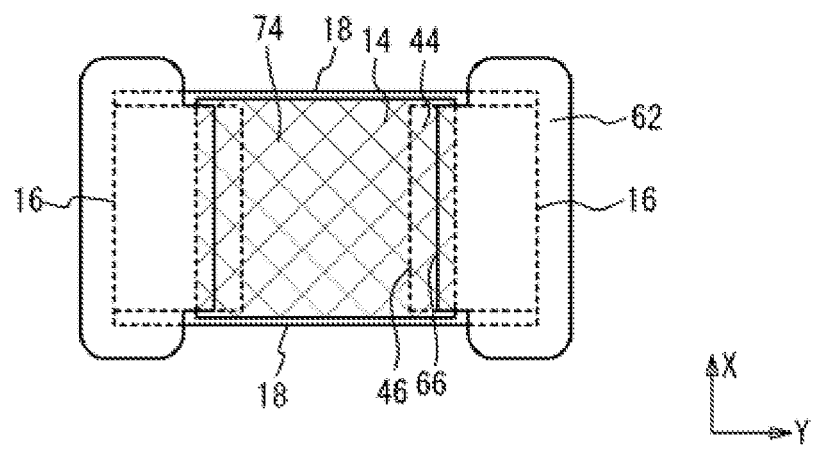
FIG. 14B is a top view of the coil component.
Figure 14C:
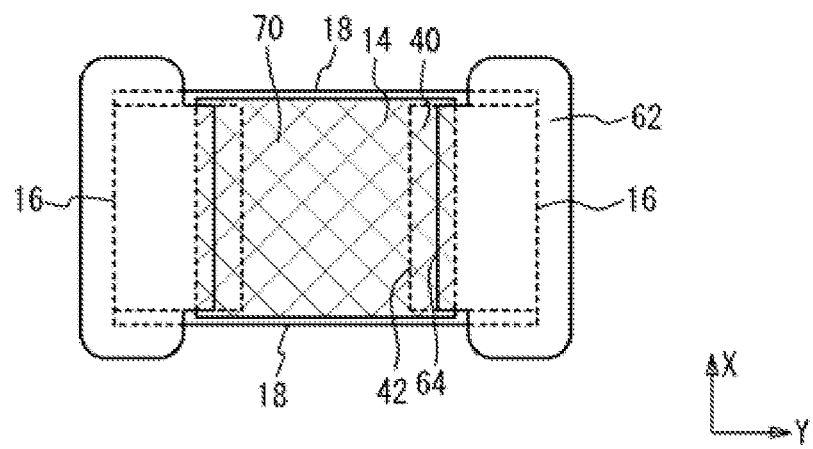
FIG. 14C is a bottom view of the coil component.

FIG. 14A is a cross-sectional view of the coil component 400, FIG. 14B is a top view of the coil component 400, and FIG. 14C is a bottom view of the coil component 400, pertaining to Example 4. As shown in FIGS. 14A through 14C, the coil component 400 pertaining to Example 4 has the top electrodes 44 (fourth metal layer) contacting the external electrodes 50, provided on the top face 12 of the insulator part 10. The insulation layer 74 is provided on the top face 12 of the insulator part 10 and covers the ends 46 of the top electrodes 44. The plating layer 60 is provided in a manner covering the bottom electrodes 40, top electrodes 44, and external electrodes 50. The plating layer 62 is provided in a manner covering each top electrode 44, with its end 66 on the top face 12 of the insulator part 10 overlapping the top electrode 44. For example, the spacing Y between the end 66 of the plating layer 62 and the end 46 of the top electrode 44 is 3 μm or more. The remaining constitutions are the same as those in Example 1 and therefore are not explained.

Figure 15:
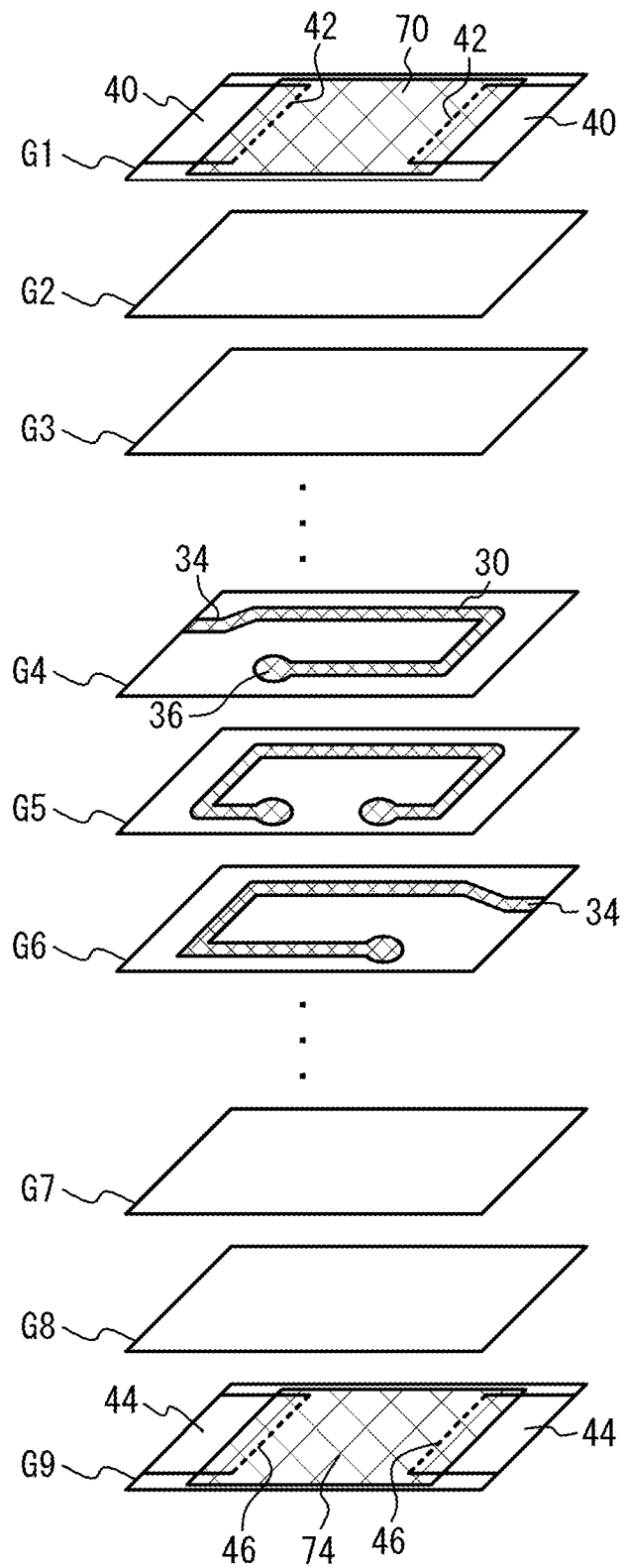
FIG. 15 is a drawing illustrating how the coil component pertaining to Example 4 is manufactured.

FIG. 15 is a drawing illustrating how the coil component 400 pertaining to Example 4 is manufactured. As shown in FIG. 15, multiple green sheets G1 to G9 are prepared. The difference from FIG. 3 in Example 1 is that the insulation layer 74 covering the top electrodes 44 and the ends 46 of the top electrodes 44 is formed on the surface of the green sheet G9 using a printing method. For example, the insulation layer 74 is formed in a manner covering the end 46 of the top electrode 44 so that, when the plating layer 62 is formed as described below, the formed end 66 of the plating layer 62 is away from the end 46 of the top electrode 44 by 3 μm or more. Except for this point, the same processing explained using FIG. 3 in Example 1 is performed.

Next, the processing explained using FIGS. 4A and 4B in Example 1 is performed to form, on the insulator part 10, the external electrodes 50 contacting the bottom electrodes 40 and top electrodes 44. Next, the barrel plating method explained using FIG. 5A in Example 1 is used to plate the insulator part 10, to form the plating layer 60 and the plating layer 62. This way, the ends 64 of the plating layer 62 on the bottom face 14 of the insulator part 10 are provided in a manner overlapping the bottom electrodes 40, while the ends 66 on the top face 12 of the insulator part 10 are provided in a manner overlapping the top electrodes 44, as shown in FIGS. 14A through 14C. For example, the plating layer 62 is formed so that its end 64 is away from the end 42 of the bottom electrode 40 by 3 μm or more, and its end 66 is away from the end 46 of the top electrode 44 by 3 μm or more.

According to Example 4, the top electrodes 44 electrically connected to the coil element 32 are provided on the top face 12 of the insulator part 10. The plating layer 62 is provided in a manner covering the bottom electrodes 40 and top electrodes 44. The plating layer 62 is provided so that its ends 64 overlap the bottom electrodes 40, while its ends 66 overlap the top electrodes 44. This way, generation of cracking in the insulator part 10 can be prevented, not only when the bottom face 14 side of the insulator part 10 is mounted onto a circuit board, but also when the top face 12 side is mounted on a circuit board.

To effectively prevent the generation of cracking in the insulator part 10, preferably the end 66 of the plating layer 62 is provided away from the end 46 of the top electrode 44 by 3 μm or more.

It should be noted that, with respect to the side electrodes formed by the external electrodes 50 on the side faces 18 of the insulator part 10, each end of the plating layer 62 on a side face 18 of the insulator part 10 may be provided in a manner overlapping a side electrode, in which case preferably it is provided away from the end of the side electrode by 3 μm or more. This way, generation of cracking in the insulator part 10 can be prevented, even when the side face 18 is mounted onto a circuit board. In other words, on at least one of the top faces 12, bottom faces 14, end faces 16, and side faces 18 of the insulator part 10, each end of the plating layer 62 may be provided in a manner overlapping an electrode provided on this face, preferably away from the end of the electrode by 3 μm or more.

Example 5

Figure 16A:
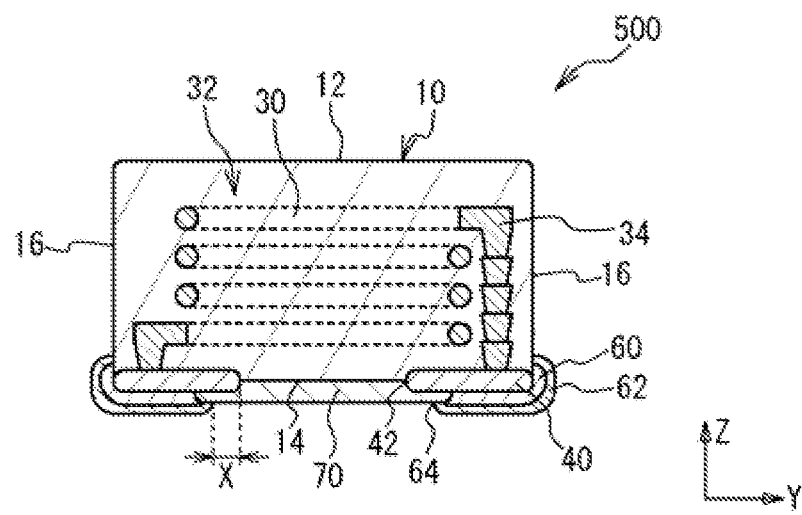
FIG. 16A is a cross-sectional view of the coil component pertaining to Example 5.
Figure 16B:
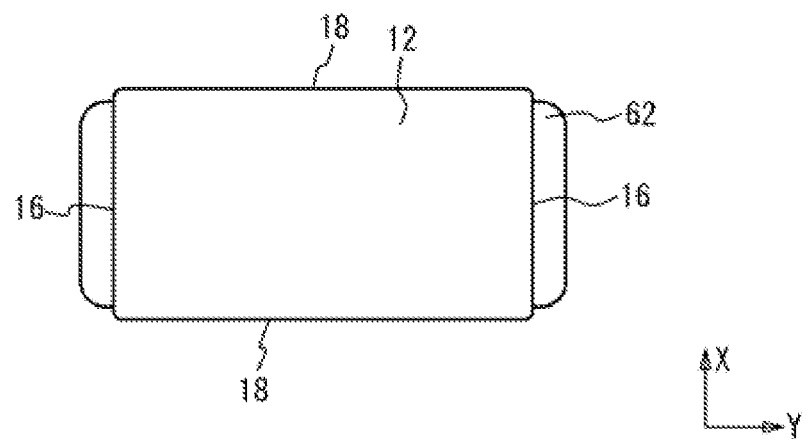
FIG. 16B is a top view of the coil component.
Figure 16C:
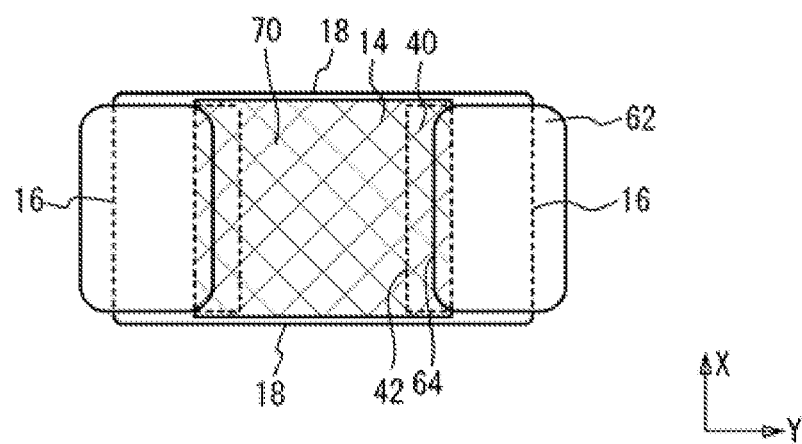
FIG. 16C is a bottom view of the coil component.

FIG. 16A is a cross-sectional view of the coil component 500, FIG. 16B is a top view of the coil component 500, and FIG. 16C is a bottom view of the coil component 500, pertaining to Example 5. As shown in FIGS. 16A through 16C, the coil component 500 pertaining to Example 5 has no external electrodes 50 provided on the insulator part 10. The conductor 30 is connected to the bottom electrodes 40 via the lead-out conductors 34 that extend in the height direction (Z-axis direction) inside the insulator part 10. The remaining constitutions are the same as those in Example 1 and therefore are not explained.

Figure 17:
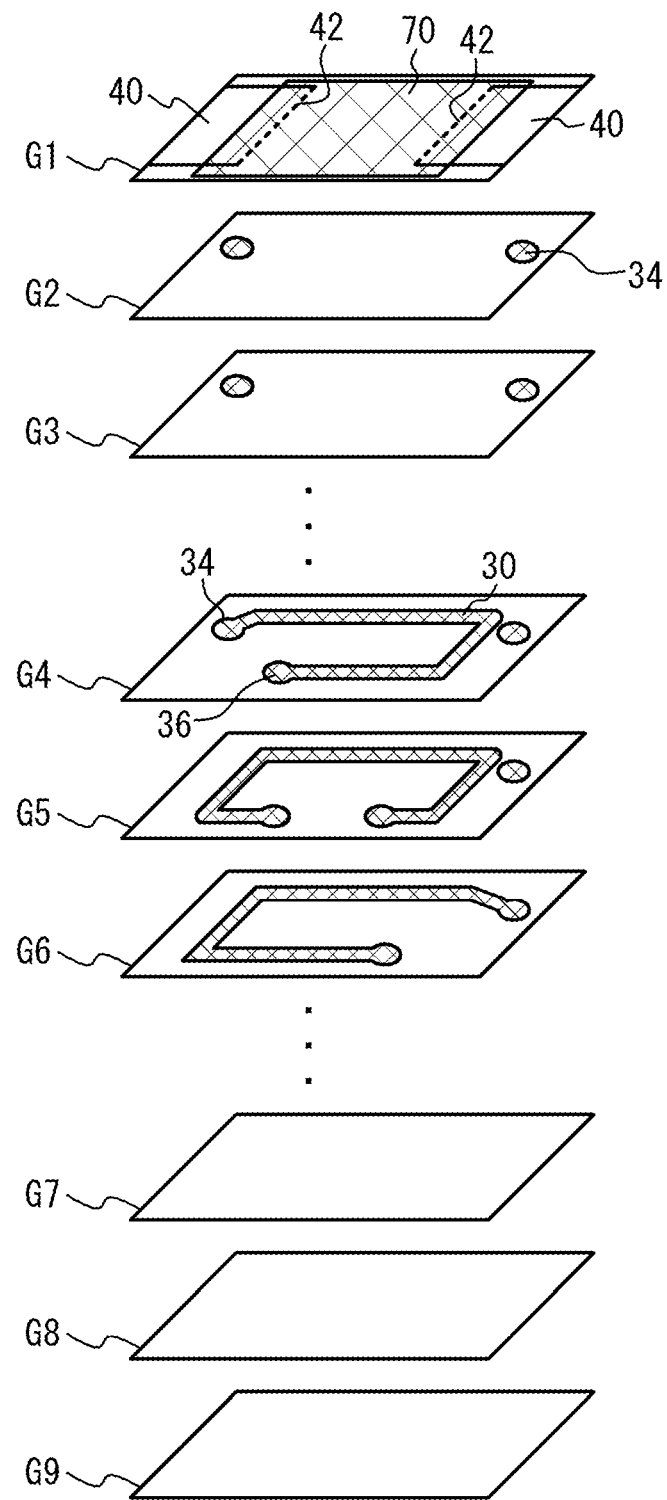
FIG. 17 is a drawing illustrating how the coil component pertaining to Example 5 is manufactured.

FIG. 17 is a drawing illustrating how the coil component 500 pertaining to Example 5 is manufactured. As shown in FIG. 17, multiple green sheets G1 to G9 are prepared. The difference from FIG. 3 in Example 1 is that the lead-out conductors 34, which are through hole conductors, are formed in the green sheets G2 to G5. Except for this point, the same processing explained using FIG. 3 in Example 1 is performed. Next, the barrel plating method explained using FIG. 5A in Example 1 is used to plate the insulator part 10, to form the plating layer 60 and the plating layer 62.

As shown in Example 5, the bottom electrodes 40 may be provided only on the bottom face 14 of the insulator part 10, with no electrode provided on any other face.

Example 6

Figure 18:
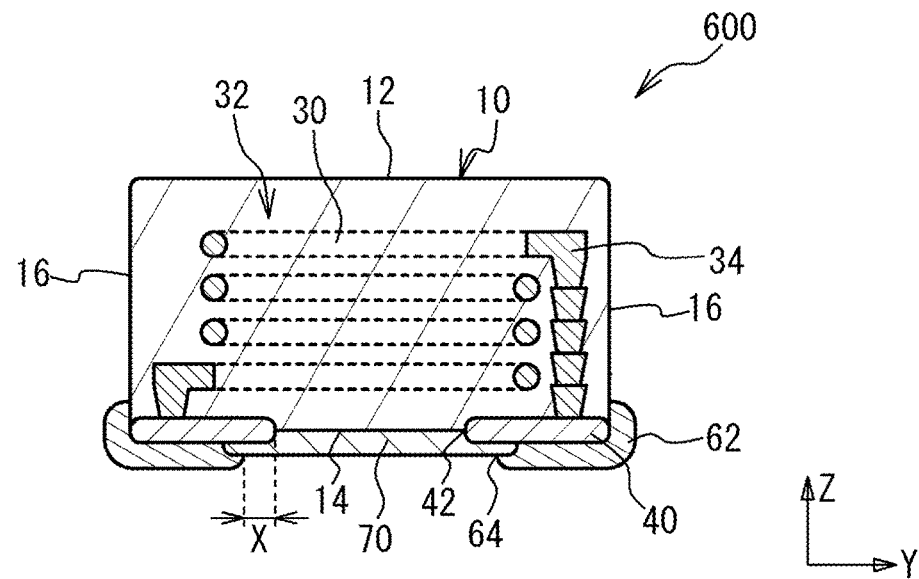
FIG. 18 is a cross-sectional view of the coil component pertaining to Example 6.

FIG. 18 is a cross-sectional view of the coil component 600 pertaining to Example 6. As shown in FIG. 18, the coil component 600 pertaining to Example 6 has no plating layer 60 provided on it, and the plating layer 62 is provided in a manner contacting the bottom electrodes 40. The bottom electrode 40 is constituted by a metal having lower solder wettability and whose melting point is higher, than the plating layer 62; for example, it is formed by nickel. The remaining constitutions are the same as those in Example 5 and therefore are not explained.

The coil component 600 pertaining to Example 6 is formed according to the same processing that defines how the coil component 500 pertaining to Example 5 is manufactured, except that the plating layer 60 is not formed. To be specific, the same method explained using FIG. 17 is used to form the coil element 32 inside the insulator part 10, and the bottom electrodes 40 electrically connected to the coil element 32 are formed on the bottom face 14 of the insulator part 10. The insulation layer 70 covering the ends 42 of the bottom electrodes 40 are formed on the bottom face 14 of the insulator part 10. Then, the plating layer 62 covering the bottom electrodes 40 is formed by the barrel plating method explained using FIG. 5A, with the insulation layer 70 used as a mask.

In Example 1 through Example 5, the plating layer 60 constituted by a metal whose melting point is higher, and having lower solder wettability, than the plating layer 62, is provided between the bottom electrode 40 and the plating layer 62, in a manner covering the bottom electrode 40, while the plating layer 62 covers the bottom electrode 40 via the plating layer 60. In the case of Example 6, however, where the bottom electrode 40 is constituted by a metal having lower solder wettability and whose melting point is higher, than the plating layer 62 (that is, the plating layer 62 is constituted by a metal having higher solder wettability and whose melting point is lower, than the bottom electrode 40), the plating layer 60 may not be provided and the plating layer 62 may cover the bottom electrode 40 directly. It should be noted that, in Example 6, the insulation layer 70 may not be provided.

Example 7

Figure 19:
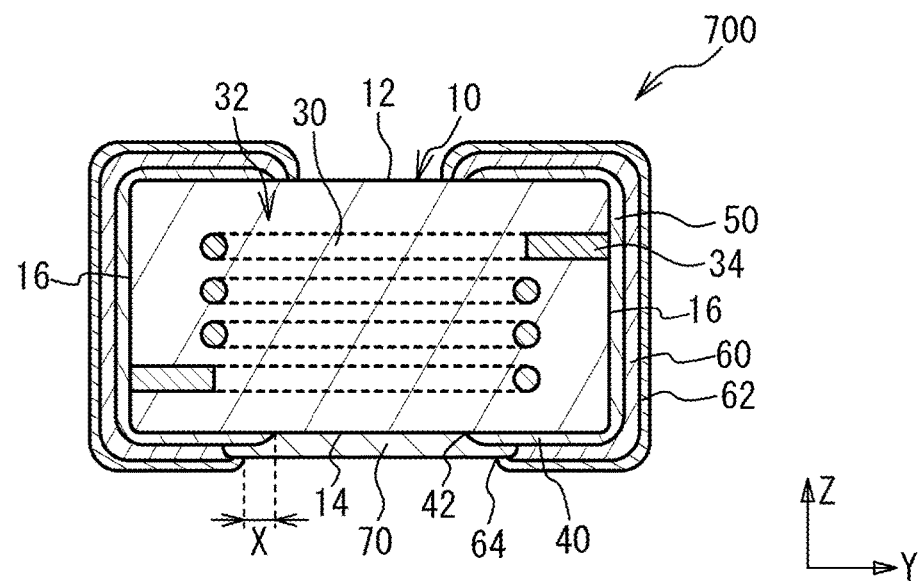
FIG. 19 is a cross-sectional view of the coil component pertaining to Example 7.

FIG. 19 is a cross-sectional view of the coil component 700 pertaining to Example 7. As shown in FIG. 19, the coil component 700 pertaining to Example 7 has its bottom electrodes 40 formed by the external electrodes 50 provided on the surface of the insulator part 10. The remaining constitutions are the same as those in Example 1 and therefore are not explained.

The bottom electrodes 40 may be provided separately from the external electrodes 50, as in Example 1, or the bottom electrodes 40 may be formed by the external electrodes 50, as in Example 7.

Example 8

Figure 20:
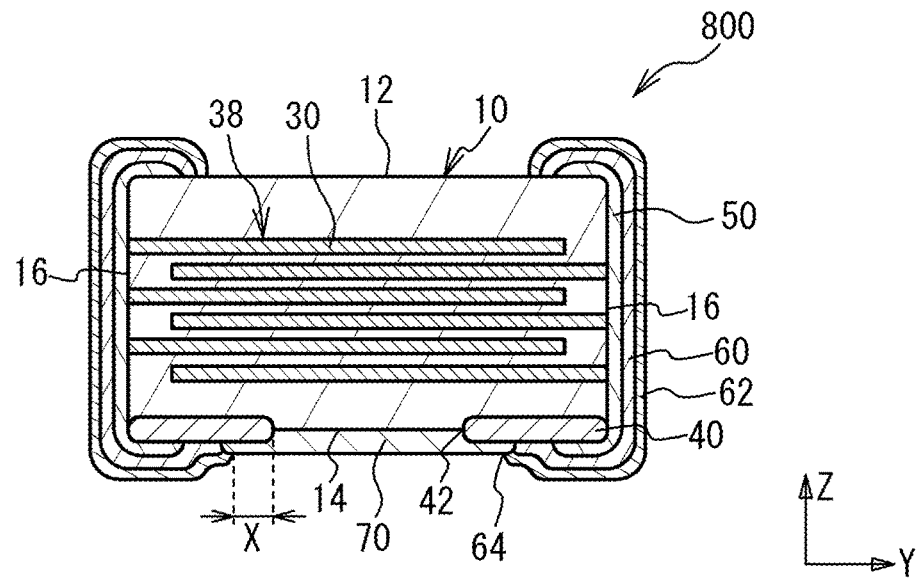
FIG. 20 is a cross-sectional view of the capacitor component pertaining to Example 8.

FIG. 20 is a cross-sectional view of the capacitor component 800 pertaining to Example 8. As shown in FIG. 20, the capacitor component 800 pertaining to Example 8 has its capacitor element 38 formed by the conductor 30 provided inside the insulator part 10. With the capacitor component 800, the insulator part 10 is formed by barium titanate ($BaTiO_3$), calcium titanate ($CaTiO_3$), or strontium titanate ($SrTiO_3$), etc., for example. The conductor 30 is formed by a metal material such as copper, silver, nickel, or palladium, etc., for example. The remaining constitutions are the same as those in Example 1 and therefore are not explained.

A coil element 32 may be formed, as in Example 1, or a capacitor element 38 may be formed, as in Example 7, inside the insulator part 10. Also, any other element, such as a thermistor element, varistor element, etc., may be formed inside the insulator part 10. These elements in combination may constitute a compound element which is formed inside the insulator part 10. In an example, such thermistor element or varistor element can have the same internal electrode structure as that of the capacitor element 38.

Example 9

Figure 21:
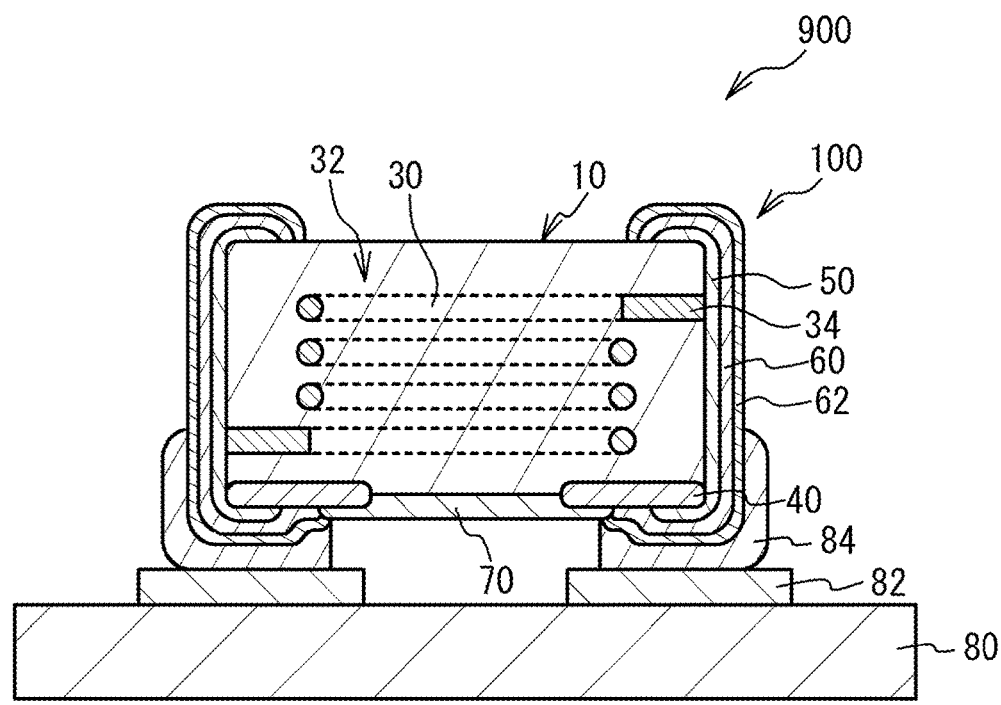
FIG. 21 is a cross-sectional view of the electronic apparatus pertaining to Example 9.

FIG. 21 is a cross-sectional view of the electronic apparatus 900 pertaining to Example 9. As shown in FIG. 21, the electronic apparatus 900 pertaining to Example 9 comprises the electrodes 82 provided on the top face of the circuit board 80, to which the plating layer 62 of the coil component 100 in Example 1 is joined via the solder 84. This way, the coil component 100 is mounted on the circuit board 80.

According to Example 9, the plating layer 62 of the coil component 100 is joined, via the solder 84, to the electrodes 82 on the circuit board 80. As a result, although stress may be applied to the plating layer 62, generation of cracking in the insulator part 10 can be prevented, as explained in Example 1, even when stress is applied to the plating layer 62.

It should be noted that, while the coil component 100 in Example 1 is mounted on the circuit board 80 in Example 9, the coil component in any one of Example 2 through Example 7 may be mounted, or the capacitor component in Example 8 may be mounted.

The foregoing explained the examples of the present invention in detail; however, the present invention is not limited to these specific examples, and various modifications and changes may be added to the extent that the key purposes of the present invention as described in "What Is Claimed Is" are not affected.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. An electronic component, comprising:
   an insulator part of rectangular solid shape;
   an electronic element provided inside the insulator part;
   a first metal layer provided on a first face of the insulator part, extending from one end side of the first face toward an opposing end side of the first face, and electrically connected to the electronic element;
   a second metal layer provided in a manner extending from the one end side of the first face toward the opposing end side of the first face, overlapping the first metal layer and having an end positioned over the first metal layer on the first face of the insulator part away from an end of the first metal layer toward the one end side of the first face, wherein a portion of the first metal layer between the end of the first metal layer and the end of the second metal layer is not overlapped with the second metal layer, as viewed from a direction toward the first face;
   a third metal layer which is arranged between the first metal layer and the second metal layer and overlaps the first metal layer as viewed from the direction toward the first face, wherein the third metal layer is constituted by a metal having a higher melting point and lower solder wettability than those of the second metal layer; and an insulation layer provided on the first face of the insulator part in a manner covering the end of the first metal layer, wherein the insulation layer has lower solder wettability than that of the second metal layer is, and the end of the second metal layer is positioned over the first metal layer via the insulation layer as viewed from the direction toward the first face.

2. The electronic component according to claim 1, wherein the end of the second metal layer is provided away from the end of the first metal layer by 3 μm or more.

3. The electronic component according to claim 1, wherein:

a pair of the first metal layers are provided away from one another on the first face of the insulator part; and the insulation layer extends from one to the other of the pair of the first metal layers.

4. The electronic component according to claim 1, wherein the third metal layer covers the entire first metal layer.

5. The electronic component according to claim 1, wherein the end of the first metal layer has a curved shape on a plan view of the first face of the insulator part.

6. The electronic component according to claim 1, wherein:

a fourth metal layer is provided on a second face of the insulator part in a manner electrically connected to the electronic element;

the second metal layer is provided in a manner overlapping the first metal layer and the fourth metal layer as viewed from the direction toward the first face and the second face, respectively; and an end of the second metal layer on the second face of the insulator part is away from an end of the fourth metal layer but over the fourth metal layer as viewed from the direction toward the second face.

7. The electronic component according to claim 1, wherein the second metal layer is a tin plating layer.

8. The electronic component according to claim 1, wherein the electronic element is a coil element, capacitor element, or a compound element of the foregoing.

9. An electronic apparatus, comprising:

the electronic component according to claim 1; and a circuit board to which the second metal layer of the electronic component has been joined via solder.

* * * * *